(12) United States Patent
Ahn et al.

(10) Patent No.: US 8,653,622 B2
(45) Date of Patent: Feb. 18, 2014

(54) SEMICONDUCTOR DEVICE INCLUDING TRANSISTOR AND FUSE CIRCUIT AND SEMICONDUCTOR MODULE INCLUDING THE SAME

(75) Inventors: Woo-Song Ahn, Hwaseong-si (KR); Satoru Yamada, Seoul (KR); Young-Jin Choi, Hwaseong-si (KR); Seung-Uk Han, Suwon-si (KR); Kyo-Suk Chae, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 528 days.

(21) Appl. No.: 13/038,117

(22) Filed: Mar. 1, 2011

(65) Prior Publication Data
US 2011/0241099 A1 Oct. 6, 2011

(30) Foreign Application Priority Data
Mar. 31, 2010 (KR) .......................... 10-2010-0029426

(51) Int. Cl.
*H01L 29/792* (2006.01)
*H01L 23/525* (2006.01)

(52) U.S. Cl.
USPC .......................................... 257/529; 257/324

(58) Field of Classification Search
USPC ................... 257/324–326, 528–535, E21.003
See application file for complete search history.

(56) References Cited

U.S. PATENT DOCUMENTS

| 7,791,111 B2 * | 9/2010 | Kuroyanagi et al. ......... 257/529 |
| 8,067,807 B2 * | 11/2011 | Taya ............................ 257/392 |
| 2008/0316852 A1 | 12/2008 | Matsufuji et al. |
| 2009/0206381 A1 | 8/2009 | Shin et al. |

FOREIGN PATENT DOCUMENTS

| JP | 2000-269471 | 9/2000 |
| JP | 2009-004578 | 1/2009 |
| JP | 2009-200497 | 9/2009 |
| KR | 10-2009-0089965 A | 8/2009 |

* cited by examiner

*Primary Examiner* — Cuong Q Nguyen
(74) *Attorney, Agent, or Firm* — Muir Patent Consulting, PLLC

(57) ABSTRACT

A semiconductor device is disclosed. The semiconductor device includes a semiconductor substrate, a first node impurity region, a second node impurity region, a third node impurity region, and an insulating layer. The first through third node impurity regions are disposed in the semiconductor substrate. Each of the first through third node impurity regions has a longitudinal length, a transverse length and a thickness respectively corresponding to first through third directions, which are perpendicular with respect to each other. The first node impurity region is parallel to the second and third node impurity regions, which are disposed in the substantially same line. The insulating layer is located between the first through third node impurity regions in the semiconductor substrate.

20 Claims, 16 Drawing Sheets

SEMICONDUCTOR DEVICE INCLUDING TRANSISTOR AND FUSE CIRCUIT AND SEMICONDUCTOR MODULE INCLUDING THE SAME

CROSS-REFERENCE TO RELATED APPLICATION

This application claims priority under 35 U.S.C. §119 to Korean Patent Application No. 10-2010-0029426 filed on Mar. 31, 2010, the disclosure of which is hereby incorporated by reference in its entirety.

BACKGROUND

1. Field

Embodiments of the inventive concept relate to a transistor and semiconductor fuse circuit, a semiconductor device including the transistor and semiconductor fuse circuit, and a semiconductor module including the semiconductor device.

2. Description of Related Art

In general, fabrication of a flash memory device includes sequentially forming a tunnel layer and a charge trap layer on a semiconductor substrate. The flash memory device may include memory cells and fuses. Each of the memory cells may store desired data using a charge trap layer. The charge trap layer may trap or detrap charges through the semiconductor substrate and allow desired electrical data to correspond to each of the memory cells.

In addition, each of the fuses may or may not electrically connect adjacent semiconductor circuits using the charge trap layer. In this case, the charge trap layer may trap or detrap charges through the semiconductor substrate and provide a transistor characteristic to each of the fuses. Thus, the fuses may determine electrical connection or disconnection between adjacent semiconductor circuits using the transistor characteristic.

However, when the fuses electrically operate, charges trapped in the charge trap layer may be leaked through the tunnel layer to the semiconductor substrate. Since the charges are detrapped from the charge trap layer, the fuses cannot embody a desired transistor characteristic using the charge trap layer. Thus, the fuses cannot set the electrical connection between the adjacent semiconductor circuits. As a result, the fuses may deteriorate electrical properties of a flash memory device.

The flash memory device may be disposed in a semiconductor memory module and/or a processor-based system. The semiconductor module and/or the processor-based system may have poor electrical properties due to the fuses of the flash memory device.

SUMMARY

Embodiments of the inventive concept provide a semiconductor fuse circuit, which may prevent de-trapping of electrons from a charge trap layer.

Embodiments of the inventive concept also provide a semiconductor device, which may prevent de-trapping of electrons from a charge trap layer of a semiconductor fuse circuit to improve electrical properties.

Embodiments of the inventive concept further provide a semiconductor module, which may prevent de-trapping of electrons from a charge trap layer of a semiconductor fuse circuit in a semiconductor device to improve electrical properties.

To these ends, embodiments of the inventive concept further provide a semiconductor device in which a tunnel layer is disposed on a charge trap layer in a semiconductor substrate, wherein a tunnel layer is configured to mold the charge trap layer in the semiconductor device, and a semiconductor module including a charge trap layer surrounded by the tunnel layer in a semiconductor device.

In a first embodiment, a semiconductor device is disclosed. The semiconductor device includes a semiconductor substrate. A first node impurity region is disposed in the semiconductor substrate. The first node impurity region has a first longitudinal length in a first direction, a first transverse length in a second direction perpendicular to the first direction, and a first thickness in a third direction perpendicular to both the first direction and the second direction. The first node impurity region includes a first side surface. A second node impurity region is disposed in the semiconductor substrate. The second node impurity region has a second longitudinal length in the first direction, a second transverse length in the second direction, and a second thickness in the third direction. The second node impurity region includes a second side surface. A third node impurity region is disposed in the semiconductor substrate. The third node impurity region has a third longitudinal length in the first direction, a third transverse length in the second direction, and a third thickness in the third direction. The third node impurity region includes a third side surface. A first insulating layer is disposed in the semiconductor substrate. The first insulating layer is located between the first side surface of the first node impurity region and the second side surface of the second node impurity region, and between the first side surface of the first node impurity region and the third side surface of the third node impurity region. The first insulating layer includes a first layer and a second layer. Sidewalls of the second layer are covered by the first layer.

In one embodiment, the first node impurity region is electrically insulated from the second and third node impurity regions by the first insulating layer. The first through third node impurity regions have a first conductive type.

In a further embodiment, the first insulating layer is in contact with the first through third side surfaces.

In a further embodiment, the semiconductor device further includes a first well region disposed in the semiconductor substrate to cover a bottom of the first node impurity region. A second well region is disposed in the semiconductor substrate to cover bottoms of the second and third node impurity regions. The first well region has the first conductivity type. The second well region has a second conductivity type different from the first conductivity type. The first and second well regions are in contact with each other under the first insulating layer.

In another embodiment, the first, second, and third node impurity regions have a higher impurity concentration than the first well region.

In a further embodiment, the semiconductor device further includes a fourth node impurity region disposed in the semiconductor substrate. The fourth node impurity region has a fourth longitudinal length in the first direction, a fourth transverse length in the second direction, and a fourth thickness in the third direction. The fourth node impurity region includes a fourth side surface.

In another embodiment, the second well region covers a bottom of the fourth node impurity region. The fourth node impurity region has the second conductivity type.

In one embodiment, the semiconductor device further includes a second insulating layer in the semiconductor substrate. The second insulating layer is spaced the second longitudinal length apart from the first insulating layer in the first direction. The second insulating layer is located between the second node impurity region and the fourth node impurity region, and between the third node impurity region and the fourth node impurity region.

In one embodiment, the second well region covers a bottom surface of the second insulating layer.

In another embodiment, the second insulating layer includes a third layer and a fourth layer. Sidewalls of the fourth layer are covered by the third layer.

In one embodiment, the first layer has a first permittivity. The second layer has a second permittivity greater than the first permittivity.

In one embodiment, the first layer includes silicon oxide and the second layer includes silicon nitride.

In one embodiment, a top surface of the second layer is exposed to the outside of the semiconductor substrate.

In one embodiment, a top surface and a bottom surface of the second layer is covered by the first layer.

In one embodiment, the semiconductor device further includes an interlayer insulating layer covering top surfaces of the first through third node impurity regions and the first insulating layer. First through third nodes are disposed on the interlayer insulating layer and electrically connected to the first through third node impurity regions, respectively.

In a further embodiment of the inventive concept, a semiconductor device is disclosed. The semiconductor device includes a semiconductor substrate. A transistor gate region is disposed in the semiconductor substrate. The transistor gate region includes a first side surface having a first thickness in a direction toward the interior of the semiconductor substrate. An insulating layer is adjacent to the transistor gate region. The insulating layer has a second thickness in the direction greater than the first thickness. The insulating layer includes a second side surface and a third side surface opposite to the second side surface. The first side surface is in contact with the second side surface. A transistor source region is disposed adjacent to the third side surface. The transistor source region includes a fourth side surface having a third thickness in the direction. The fourth side surface is in contact with the third side surface. A transistor drain region is disposed adjacent to the third side surface. The transistor drain region includes a fifth side surface having a fourth thickness in the direction. The fifth side surface is in contact with the third side surface. A channel region is between the transistor source region and the transistor drain region. Top surfaces of the semiconductor substrate, the transistor gate region, the transistor source region, and the transistor drain region have the same level.

In one embodiment, the first thickness, third thickness, and fourth thickness are substantially the same. The second thickness is greater than the first, third and fourth thicknesses.

In another embodiment, the insulating layer includes a tunnel layer having a first permittivity. A charge trap layer has a second permittivity greater than the first permittivity. The tunnel layer covers sidewalls and a bottom of the charge trap layer.

In another embodiment, the tunnel layer is in contact with the second and third side surfaces.

In a further embodiment of the inventive concept, a semiconductor module includes at least one semiconductor device. The at least one semiconductor device a semiconductor substrate. A first node impurity region is disposed in the semiconductor substrate. The first node impurity region has a first longitudinal length in a first direction, a first transverse length in a second direction perpendicular to the first direction, and a first thickness in a third direction perpendicular to both the first direction and the second direction. The first node impurity region includes a first side surface. A second node impurity region is disposed in the semiconductor substrate. The second node impurity region has a second longitudinal length in the first direction, a second transverse length in the second direction, and a second thickness in the third direction. The second node impurity region includes a second side surface. A third impurity region is disposed in the semiconductor substrate. The third node impurity region has a third longitudinal length in the first direction, a third transverse length in the second direction, and a third thickness in the third direction. The third node impurity region includes a third side surface. An insulating layer is disposed in the semiconductor substrate. The insulating layer is located between the first side surface of the first node impurity region and the second side surface of the second node impurity region, and between the first side surface of the first node impurity region and the third side surface of the third node impurity region. The insulating layer includes a first layer and a second layer. Sidewalls of the second layer are covered by the first layer

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to like parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
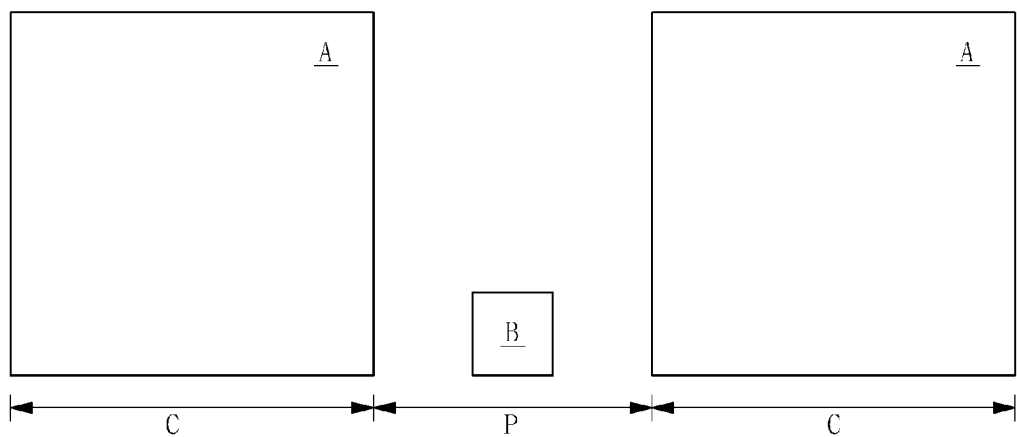
FIG. 1 is a plan view of an exemplary semiconductor device according to example embodiments.

Various embodiments will now be described more fully with reference to the accompanying drawings in which some embodiments are shown. These inventive concepts however, may be embodied in different forms and should not be construed as limited to the embodiments set forth herein.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

As used herein, since the kinds of materials of components may be well known to those skilled in the art, the materials of the components are only divided into conductive materials and insulating materials unless the context clearly indicates otherwise.

The term "at least one" includes any and all combinations of one or more of the associated listed items. Meanwhile, spatially relative terms, such as "between," "upper," "lower," "adjacent to," "on" and the like, which are used herein for ease of description to describe one element or feature's relationship to another element(s) or feature(s) as illustrated in the figures, should be interpreted in relation to each other. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items.

As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the inventive concept.

Hereinafter, a semiconductor device including a semiconductor fuse circuit according to embodiments will be described in further detail with reference to FIGS. 1 through 3.

FIG. 1 is a plan view of an exemplary semiconductor device according to example embodiments.

Referring to FIG. 1, a semiconductor device 94 according to example embodiments includes a cell array region C and a peripheral circuit region P. The semiconductor device 94 may include a volatile memory device or a nonvolatile memory device. The cell array region C may be surrounded by the peripheral circuit region P. In one embodiment, the cell array region C includes a plurality of memory cell regions A. The plurality of memory cell regions A may include memory cells.

In one embodiment, the memory cells are periodically and repetitively disposed at predetermined intervals in the plurality of memory cell regions A. For a volatile memory device, each of the memory cells may include a data storage layer disposed adjacent to a gate structure of a transistor. For a non-volatile memory device, each of the memory cells may include a data storage layer disposed in a gate structure of a transistor. The peripheral circuit region P may include at least one fuse region B.

The at least one fuse region B may be disposed adjacent to the plurality of memory cell regions A. The plurality of memory cell regions A and the at least one fuse region B may be periodically and repetitively disposed in the semiconductor device 94. The at least one fuse region B may include a semiconductor fuse circuit 84 of FIGS. 2A, 2B, and 3.

Figure 2A:
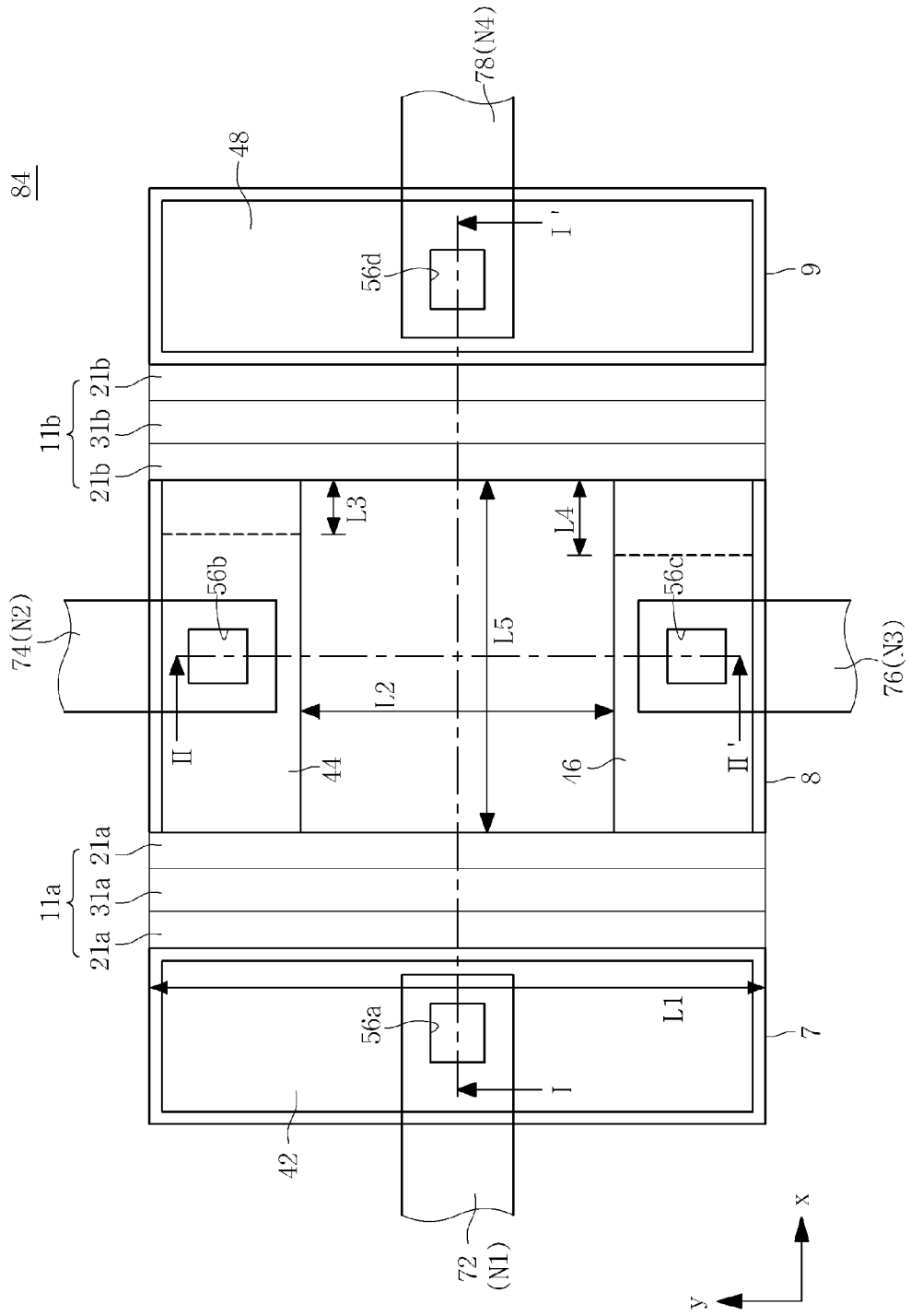
FIG. 2A is a plan view of an exemplary semiconductor fuse circuit disposed in a fuse region of FIG. 1.
Figure 2B:
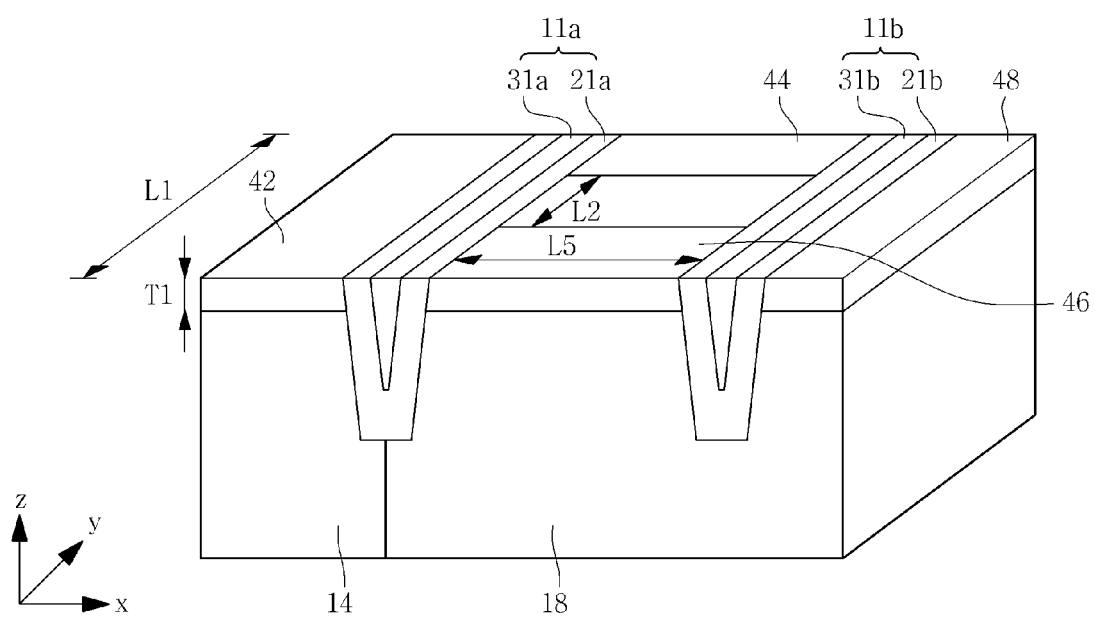
FIG. 2B is a perspective view of an exemplary semiconductor device embodying a transistor, according to one exemplary embodiment.

FIG. 2A is a plan view of an exemplary semiconductor fuse circuit disposed in the fuse region B of FIG. 1. FIG. 2B illustrates a perspective view of an exemplary transistor portion of the semiconductor fuse circuit of FIG. 2A. FIG. 3 illustrates cross-sectional views of the semiconductor fuse circuit taken along the lines I-I' and II-II' of FIG. 2A.

Figure 3:
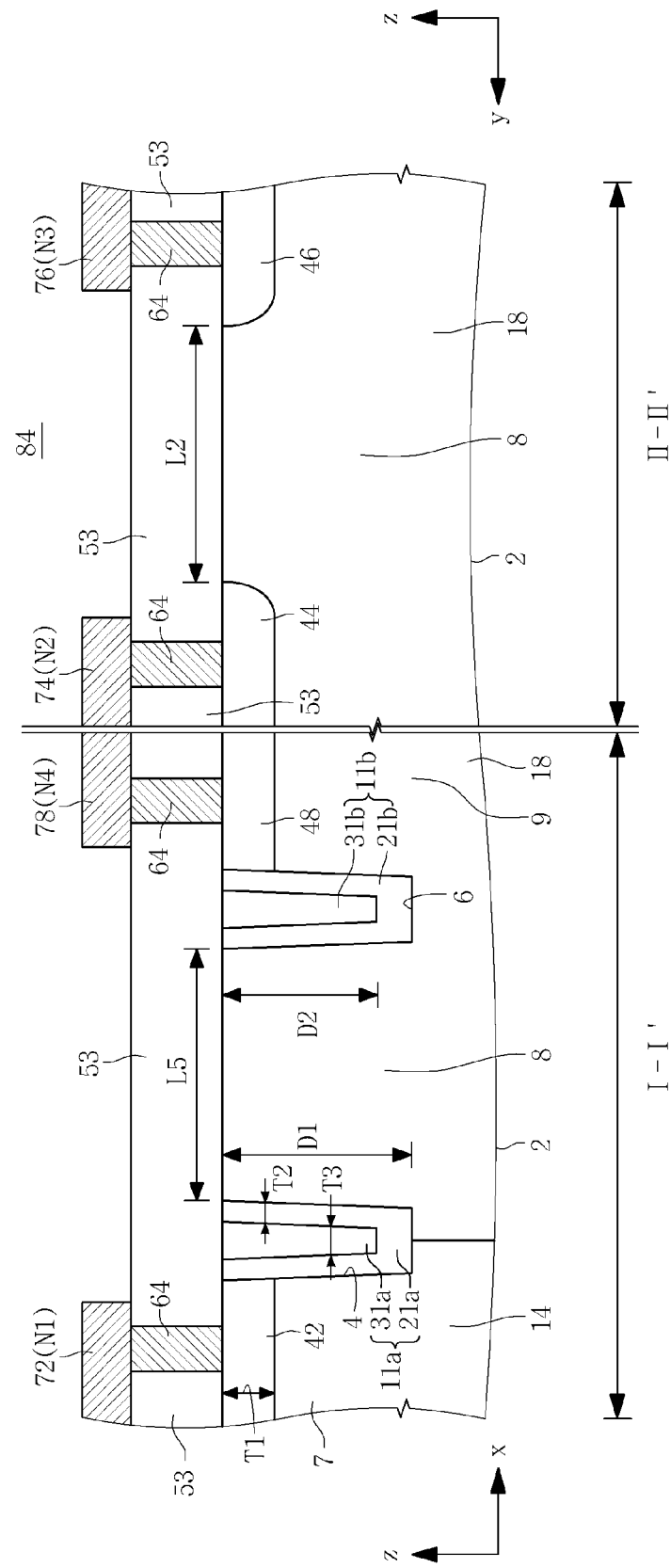
FIG. 3 is an exemplary cross-sectional view taken along lines I-I' and II-II' of FIG. 2A, showing a semiconductor fuse circuit according to example embodiments.

Referring to FIGS. 2A, 2B, and 3, a semiconductor fuse circuit 84 according to example embodiments may be disposed in the at least one fuse region B of FIG. 1. The semiconductor fuse circuit 84 may include a transistor, which may include a control gate region, floating gate region, and source and drain regions. In one embodiment, the semiconductor fuse circuit 84 includes first through third active regions 7, 8, and 9, as shown in FIG. 2A. The first through third active regions 7, 8, and 9 may be sequentially disposed along an X direction. The first active region 7 may have a predetermined length L1 along the Y direction, and the second active region 8 may have a predetermined length L5 along the X direction. The second and third active regions 8 and 9 may have substantially the same length as the first active region 7 in the Y direction, or may have different lengths.

As shown in FIGS. 2A and 2B, in one embodiment, semiconductor fuse circuit 84 includes first node impurity region 42, second node impurity region 44, third node impurity region 46, fourth node impurity region 48, first well region 14, second well region 18, first and second insulating layers 11a and 11b, first through fourth nodes N1-N4 (72, 74, 76, and 78), and connection holes 56a, 56b, 56c, and 56d.

The first active region 7 may include the first node impurity region 42, which in one embodiment, corresponds to a gate region of a transistor. The second active region 8 may include the second and third node impurity regions 44 and 46, which in one embodiment correspond to source and drain regions of a transistor. The third active region 9 may include the fourth node impurity region 48, which in one embodiment corresponds to a body or sub-region of a transistor.

In one embodiment, each of the first through fourth node impurity regions 42, 44, 46, and 48 have a thickness in the Z direction, a longitudinal length in the X direction, and transverse length in the Y direction. In one embodiment, all of the four node impurity regions have the same thickness (e.g., T1) in the Z direction. However, the different node impurity regions may have different thicknesses.

The first active region 7 may be disposed in the first well region 14 below the first node impurity region 42 in the Z direction. The second and third active regions 8 and 9 may be disposed in the second well region 18 below the second through fourth node impurity regions 44, 46, and 48 in the Z direction.

In one embodiment, the first and second insulating layers 11a and 11b each may include first and second tunnel layers 21a and 21b and first and second charge trap layers 31a and 31b. The first and second tunnel layers 21a and 21b may surround or cover sidewalls and bottom surfaces of the first and second charge trap layers 31a and 31b. The first tunnel layer 21a and the first charge trap layer 31a may extend in the Y direction and be located between the first active region 7 and the second active region 8. The second tunnel layer 21b and the second charge trap layer 31b may extend in the Y direction and be located between the second active region 8 and the third active region 9. Thus, the insulating layers 11a and 11b may insulate the three active regions 7, 8, and 9 from each other. The tunnel layers 21a and 21b and charge trap layers 31a and 31b are described further below.

First node impurity region 42 has a thickness in the Z direction, a longitudinal length in the X direction, and a transverse length in the Y direction. In one embodiment, the transverse length is greater than the longitudinal length. The transverse length may be the same as the length L1 of the first active region 7, or maybe smaller. As shown in FIG. 2B, first node impurity region 42 has a top surface facing away from the first well region 14 in the Z direction, and a bottom portion adjacent to the first well region 14 in the Z direction. The first node impurity region 42 also has a side surface facing the first tunnel layer 21a and also facing side surfaces of the second and third node impurity regions 43 and 44 in second active region 8 in the X direction. The side surface of the first node impurity region 42 facing the first tunnel layer 21a may be adjacent to the first tunnel layer 21a and may be also in contact with the first tunnel layer 21a.

The second and third node impurity regions 44 and 46 have a thickness in the Z direction, a longitudinal length in the X direction, and a transverse length in the Y direction. In one embodiment, the longitudinal length for the second node impurity region 44 is greater than its transverse length, and the longitudinal length for the third node impurity region 46 is greater than its transverse length. As shown in FIG. 2B, each of second and third node impurity regions 44 and 46 have a top surface facing away from the second well region 18 in the Z direction, and a bottom portion adjacent to the second well region 18 in the Z direction.

Each of second and third node impurity regions 44 and 46 has side surfaces. In one embodiment, a first side surface of each of second and third node impurity regions 44 and 46 faces the first tunnel layer 21a and faces parts of the side surface of the first node impurity region 42 in first active region 7 in the X direction. The first side surfaces of second and third node impurity regions 44 and 46 may be adjacent to the first tunnel layer 21a and may be also in contact with the first tunnel layer 21a. In one embodiment, second side surfaces of the second and third node impurity regions 44 and 46 opposite the first side surfaces face the second tunnel layer 21b and face parts of a side surface of the fourth node impurity region 48 in the third active region 9 in the X direction. The second side surfaces of second and third node impurity regions 44 and 46 may be adjacent to the second tunnel layer 21b and may be also in contact with the second tunnel layer 21b, as shown in FIG. 2B. In one embodiment, as shown in FIG. 2A referring to the dotted lines in regions 44 and 46, the second side surfaces of second and third node impurity regions 44 and 46 may not be in contact with the second tunnel layer 21b, but instead are separated by distances L3 and L4 in the X direction from the second tunnel layer 21b or from the edge of the second active region 8. The distances L3 and L4 may be the same, or L3 may be greater than L4, or L4 may be greater than L3.

The fourth node impurity region 48 has a thickness in the Z direction, a longitudinal length in the X direction, and a transverse length in the Y direction. In one embodiment, the transverse length is greater than the longitudinal length. The fourth node impurity region 48 may have substantially the same length as or a different length from the third active region 9 along the Y direction. As shown in FIG. 2B, fourth node impurity region 48 has a top surface facing away from the second well region 18 in the Z direction, and a bottom portion adjacent to second well region 18 in the Z direction. The fourth impurity region 48 also has a side surface facing the second tunnel layer 21b and also facing the second side surfaces of the second and third impurity regions 43 and 44 in the second active region 8 in the X direction. The side surface of the fourth impurity region 48 facing the second tunnel layer 21b may be adjacent to the second tunnel layer 21b and may be also in contact with the second tunnel layer 21b.

The first well region 14 may be disposed below the first node impurity region 42 and below a part of the first tunnel layer 21a. As such, a top portion of the first well region 14 may face and cover and thus surround a bottom portion of the first node impurity region 42 in the Z direction. Part of the first well region 14 may also face and cover a part of a bottom surface of the first tunnel layer 21a in the Z direction. In addition, a sidewall of first well region 14 may face a sidewall of the first tunnel layer 21a in the X direction. The sidewall of the first well region 14 may be adjacent to and may be in contact with the sidewall of the first tunnel layer 21a. The first well region 14 may be adjacent to and may be in contact with the second well region 18 below the first tunnel layer 21a.

The second well region 18 may be disposed below the second through fourth node impurity regions 44, 46, and 48 and below the second tunnel layer 21b. As such, a top portion of second well region 18 may face and cover bottom portions of the second through fourth node impurity regions 44, 46, and 48 in the Z direction. In addition, part of well region 18 may extend between the second and third node impurity regions 44 and 46 in the Y direction and between the first and second tunnel layers 21a, 21b in the X direction, to a level substantially the same as the top surfaces of the second and third node impurity regions 44 and 46 in the Z direction. Therefore, in one embodiment, a first part of the top portion of second well region 18 may be adjacent to and may be in contact with the bottom portion of the second through fourth node impurity regions 44, 46, and 48, and a second part of the top portion of the second well region 18 may be exposed to the outside of the semiconductor substrate. In addition, sidewalls of the second well region 18 may face sidewall of the second tunnel layer 21b, and may cover and surround portions of the sidewalls and a bottom surface of the second tunnel layer 21b in the X and Z directions respectively.

In one embodiment, the first node impurity region 42 has a first conductivity type, and the second and third node impurity regions 44 and 46 have the same first conductivity type. For example, the first through third node impurity regions 42, 44, and 46 may have an N-type or P-type conductivity. In addition, the first through third node impurity regions 42, 44, and 46 may have substantially the same doping level, so that they have substantially the same impurity concentration. In one embodiment, the first well region 14 has the same conductivity type as the first through third node impurity regions 42, 44, and 46. However, the first well region 14 may have a different doping level and impurity concentration, and thus a different conductivity from the first through third node impurity regions 42, 44, and 46. For example, the first well region 14 may have a lower doping level and impurity concentration, and thus a lower conductivity than the first through third node impurity regions 42, 44, and 46.

In one embodiment, fourth node impurity region 48 has a second conductivity type. The second conductivity type may be a different, opposite type from the first conductivity type (e.g., if the first conductivity type is N-type, then the second conductivity type may be P-type and vice versa). In one embodiment, the second well region 18 has a different conductivity type from the first through third node impurity regions 42, 44, and 46, and the same conductivity type as the fourth node impurity region 48. However, the second well region 18 may have a different doping level and impurity concentration, and thus a different conductivity from the fourth node impurity region 48. For example, the second well region 18 may have a lower doping level and impurity concentration, and thus a lower conductivity than the fourth node impurity regions 48.

A first node N1, 72 may extend from the first node impurity region 42 toward the outside of the first active region 7 along the X direction. The first node 72 may partially overlap the first node impurity region 42. The first node 72 may be electrically connected to the first node impurity region 42 through a first connection hole 56a.

A second node N2, 74 and a third node N3, 76 may extend from the second and third node impurity regions 44 and 46 toward the outside of the second active region 8 along the Y direction. The second and third nodes 74 and 76 may overlap the second and third node impurity regions 44 and 46, respectively. The second and third nodes 74 and 76 may be electrically connected to the second and third node impurity regions 44 and 46 through the second and third connection holes 56b and 56c, respectively.

A fourth node N4 78 may extend from the fourth node impurity region 48 toward the outside of the third active region 9 along the X direction. The fourth node 78 may be electrically connected to the fourth node impurity region 48 through a fourth connection hole 56d. The fourth node 78 may overlap the fourth node impurity region 48.

The tunnel layers 21a and 21b may have a first permittivity and the charge trap layers 31a and 31b may have a second permittivity greater than the first permittivity. For example, the tunnel layers 21a and 21b may include silicon oxides and the charge trap layers 31a and 31b may include silicon nitrides. In other example embodiments, the charge trap layers 31a and 31b may include silicon oxy-nitrides (SixOyNz) or polycrystalline silicon.

Referring to FIG. 3, a semiconductor fuse circuit 84 according to example embodiments may include first and second insulating layers sequentially disposed in the X direction. The first and second insulating layers may define first through third active regions 7, 8, and 9 of FIG. 2A. For example, the first insulating layer may be buried in a first trench 4 between the first and second active regions 7 and 8. The second insulating layer may be buried in a second trench 6 between the second and third active regions 8 and 9.

In one embodiment, the first and second insulating layers 11a and 11b include the tunnel layers 21a and 21b and the charge trap layers 31a and 31b, respectively. The tunnel layers 21a and 21b may conformably cover sidewalls and bottom surfaces of the first and second trenches 4 and 6. The tunnel layers 21a and 21b may extend to a predetermined depth D1 from the top surface of the semiconductor substrate 2 toward the bottom surfaces of the first and second trenches 4 and 6. Each of the tunnel layers 21a and 21b may be formed, for example, to a thickness T2 of about 50 to 100 Å.

The charge trap layers 31a and 31b may be disposed on the tunnel layers 21a and 21b to be buried in the first and second trenches 4 and 6. In this case, the charge trap layers 31a and 31b may extend to a predetermined depth D2 from the top surface of the semiconductor substrate 2 toward a lower portion of the semiconductor substrate 2. In one embodiment, the charge trap layers 31a and 31b may fully fill the remainder of the trench. At least a portion of (e.g., a top surface of) the charge trap layers 31a and 31b may be exposed by the tunnel layers 21a and 21b to the outside of the semiconductor substrate. Each of the charge trap layers 31a and 31b may be formed, for example, to a thickness T3 of about 200 to 250 Å.

The first and second trenches 4 and 6 may be spaced a predetermined length L5 apart from each other along the X direction. The first and fourth node impurity regions 42 and 48 may be electrically insulated from the second and third node impurity regions 44 and 46 by the first and second insulating layers 11a and 11b.

In one embodiment, the first node impurity region 42 may be in contact with the first insulating layer 11a through a side portion of the first active region 7 (e.g., a side surface of the first node impurity region 42 may be in contact with a sidewall of the first insulating layer 11a). The fourth node impurity region 48 may or may not be in contact with the second insulating layer 11b through a side portion of the third active region 9.

In one embodiment, the first well region 14 may be in contact with the first insulating layer 11a through the side portion of the first active region 7 (e.g., a sidewall of the first well region 14 may be in contact with a sidewall of the first insulating layer 11a). The second well region 18 may be disposed in the second and third active regions 8 and 9 and cover or surround the second through fourth node impurity regions 44, 46, and 48 and the second insulating layer 11b (e.g., it may cover a bottom portion of fourth node impurity region 48, bottom portions and certain side portions of second and third node impurity regions 44, 46, and sidewalls and a bottom surface of the second insulating layer 11b). A sidewall of the second well region 18 may be in contact with a sidewall of the first insulating layer 11a and a portion of the second well region 18 may be also in contact with a bottom surface of the first insulating layer 11a. The second well region 18 may be in contact with the first well region 14 under the first insulating layer 11a. As such, the combined well regions may surround bottom portions, including sidewalls and a bottom surface, of each of the first and second insulating layers 11a and 11b.

An interlayer insulating layer 53, first plugs 64, and first through fourth nodes 72, 74, 76, and 78 may be disposed on the semiconductor substrate 2 along the Z direction. The interlayer insulating layer 53 may cover the first through third active regions 7, 8, and 9, the first through fourth node impurity regions 42, 44, 46, and 48, and the first and second insulating layers. The first plugs 64 may vertically penetrate the interlayer insulating layer 53 and be in contact with the first through fourth node impurity regions 42, 44, 46, and 48, respectively.

First through fourth nodes 72, 74, 76, and 78 may be disposed on the interlayer insulating layer 53. The first through fourth nodes 72, 74, 76, and 78 may be in contact with the first plugs 64, respectively.

As shown in FIGS. 2A, 2B, and 3, the semiconductor fuse circuit 84 may include a control gate region 42 (i.e. the first node impurity region 42), a floating gate/charge trap region 31a (i.e. the first charge trap layer 31a), and source/drain regions 44 and 46 (i.e. the second and third node impurity regions 44 and 46). That is, rather than a bottom surface of a control gate facing a top surface of a floating gate through an oxide layer, a side surface of the control gate/first node impurity region 42 may be in contact with a sidewall of a first tunnel layer 21a and faces a sidewall of the floating gate/charge trap region 31a, and side surfaces of the second and third node impurity regions (e.g., source/drain regions) 44 and 46 may be in contact with an opposite sidewall of the first tunnel layer 21a and face an opposite sidewall of the floating gate/charge strap region 31a. Top surfaces of the control gate/first node impurity region 42, and top surfaces of the second and third node impurity regions (e.g., source/drain regions) 44 and 46, may be located at substantially the same level in the Z direction, which may coincide with a top surface of the semiconductor substrate 2. The firs tunnel layer 21a separating the floating gate/charge trap region 31a from the control gate and source and drain regions may surround the floating gate/charge trap region 31a within the first trench 4 (i.e., sidewall and bottom surface), and, as described further below with respect to FIG. 7, may entirely surround the floating gate/charge trap region 31a in the X and Z directions (e.g., by also covering the top surface of the floating gate/charge trap region 31a).

Embodiment 1

Figure 4:
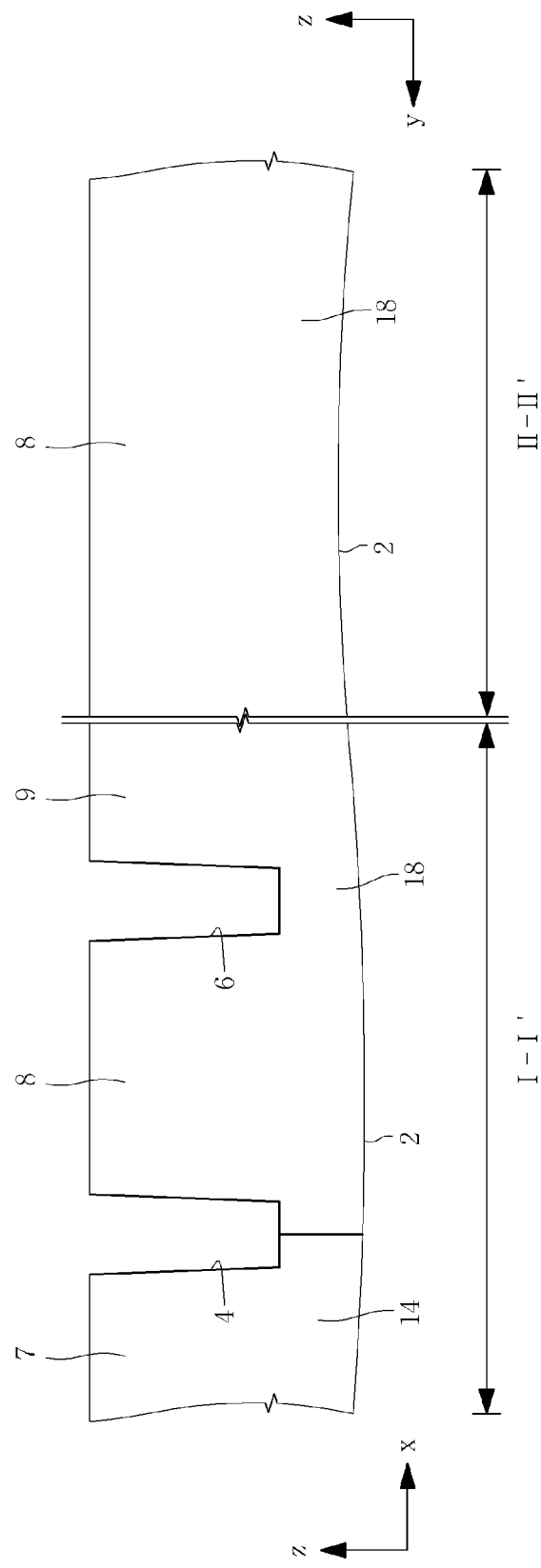
FIGS. 4 through 6 are exemplary cross-sectional views taken along lines I-I' and II-II' of FIG. 2A, illustrating a method of forming a semiconductor fuse circuit according to example embodiments.
Figure 5:
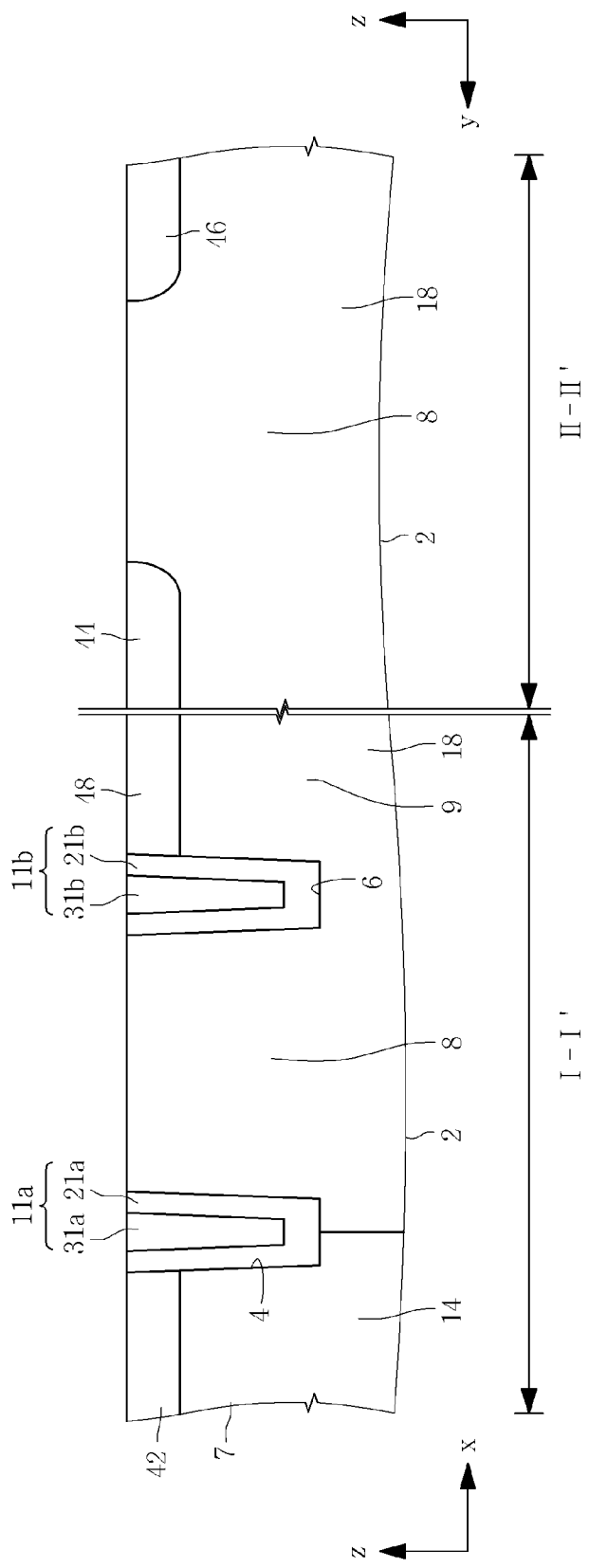
Figure 6:
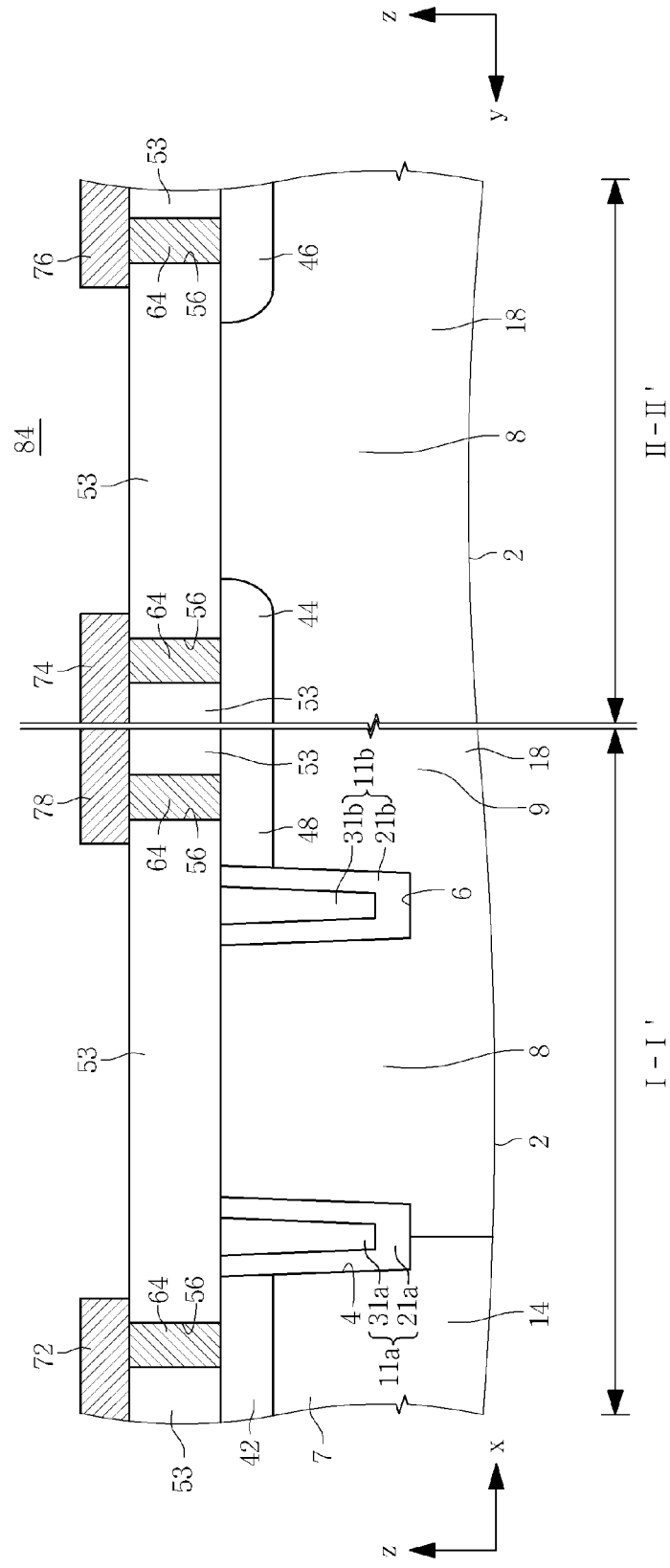

FIGS. 4 through 6 are cross-sectional views taken along lines I-I' and II-II' of FIG. 2A, illustrating a method of forming the semiconductor fuse circuit according to example embodiments. FIGS. 4 through 6 use like reference numerals for like elements as shown in FIGS. 2A, 2B, and 3.

Referring to FIG. 4, according to example embodiments, a semiconductor substrate 2 may be prepared. In one embodiment, the semiconductor substrate 2 may include single crystalline silicon. First and second trenches 4 and 6 are horizontally formed in sequence in the semiconductor substrate 2. The first and second trenches 4 and 6 may vertically extend from a top surface of the semiconductor substrate 2 toward a lower portion of the semiconductor substrate 2. In one embodiment, the first and second trenches 4 and 6 define the first through third active regions 7, 8, and 9.

First and second well regions 14 and 18 are formed in the semiconductor substrate 2. The first well region 14 may have an N-type or a P-type conductivity. The first active region 7 may be formed in the first well region 14. The second well region 18 may have a different (e.g., opposite) conductivity type from the first well region 14 (e.g., one region may have a P-type impurity, and the other region may have an N-type impurity). The second and third active regions 8 and 9 may be formed in the second well region.

The first and second well regions 14 and 18 may be in contact with each other under the first trench 4. In one embodiment, the first and second well regions 14 and 18 are formed in the semiconductor substrate 2 before the formation of the first and second trenches 4 and 6. Alternatively, the first and second well regions 14 and 18 may be formed after the formation of the first and second trenches 4 and 6.

Referring to FIG. 5, according to example embodiments, first and second tunnel layers 21a and 21b are formed in the first and second trenches 4 and 6. Each of the tunnel layers 21a and 21b may include, for example, silicon oxide. The tunnel layers 21a and 21b may be conformally formed in the first and second trenches 4 and 6 to cover sidewalls and a bottom surface of trenches 4 and 6. In one embodiment, charge trap layers 31a and 31b are formed on sidewalls and bottom surfaces of the tunnel layers 21a and 21b. The charge trap layers 31a and 31b may therefore also be formed in and may fill the first and second trenches 4 and 6. The tunnel layers 21a and 21b and charge trap layers 31a and 31b may be exposed outside the semiconductor substrate 2, for example at the top surface of the semiconductor substrate 2.

Each of the charge trap layers 31a and 31b may include, for example, silicon nitride or polycrystalline silicon. The first tunnel layer 21a and the first charge trap layer 31a in the first trench 4 constitute a first insulating layer 11a. The second tunnel layer 21b and the second charge trap layer 31b in the second trench 6 constitute a second insulating layer 11b. In one embodiment, when the first and second well regions 14 and 18 of FIGS. 2A and 2B are not formed before the formation of the first and second trenches 4 and 6, the first and second well regions 14 and 18 may be formed after the formation of the charge trap layers 31a and 31b.

Subsequently, first through fourth node impurity regions 42, 44, 46, and 48 may be formed in the first and second well regions 14 and 18. The first and fourth node impurity regions 42 and 48 may be formed at opposite ends of (e.g., adjacent opposite side surfaces) the second and third node impurity regions 44 and 46 in the X direction, and may be formed outside of a region defined by the first and second insulating layers 11a and 11b in the X direction. The first through fourth node impurity regions 42, 44, 46, and 48 may be formed at the same level in the Z direction.

In one embodiment, the first through third node impurity regions 42, 44, and 46 have the same conductivity type as the first well region 14, and have a different conductivity type form the second well region 18. The fourth node impurity region 48 may have a different conductivity type from the first well region 14, which in one embodiment, is the same conductivity type as the second well region 18.

The first and fourth node impurity regions 42 and 48 may be formed on the first and second insulating layers along the X direction. The second and third node impurity regions 44 and 46 may be formed opposite each other, separated by a portion of the second well region 18, as shown in FIGS. 2A and 2B. In one embodiment, the second and third node impurity regions 44 and 46 are each formed adjacent both the first and second insulating layers 11a and 11b.

At least one of the second and third node impurity regions 44 and 46 may be in contact with a side portion of the second active region 8 of FIGS. 2A and 2B and/or the second insulating layer 11b. However, in one embodiment, the second and third node impurity regions 44 and 46 may not be in contact with the side portion of the second active region 8 of FIGS. 2A and 2B adjacent the second insulating layer 11b, and/or may not be in contact with the second insulating layer 11b.

Referring to FIG. 6, according to example embodiments, an interlayer insulating layer 53 may be formed on the first and second insulating layers 11a and 11b to cover the first through fourth node impurity regions 42, 44, 46, and 48. The interlayer insulating layer 53 may be formed on the first through third active regions 7, 8, and 9 along the Z direction. The interlayer insulating layer 53 may include an insulating material. First through fourth connection holes 56 may be formed in the interlayer insulating layer 53.

In one embodiment, the first through fourth connection holes 56 may penetrate the interlayer insulating layer 53 and expose the first through fourth node impurity regions 42, 44, 46, and 48. Subsequently, first plugs 64 are formed in the interlayer insulating layer 53 to fill the first through fourth connection holes 56. The first plugs 64 may include a conductive material. First through fourth nodes 72, 74, 76, and 78 are then formed on the interlayer insulating layer 53 to be in contact with the first plugs 64. The first through fourth nodes 72, 74, 76, and 78 may also include a conductive material.

In one embodiment, the first through fourth nodes 72, 74, 76, and 78 constitute a semiconductor fuse circuit 84 together with the first through third active regions 7, 8, and 9, the first and second insulating layers 11a and 11b, the first and second well regions 14 and 18, and the first through fourth node impurity regions 42, 44, 46, and 48. The semiconductor fuse circuit 84 may have a transistor structure.

Embodiment 2

Figure 7:
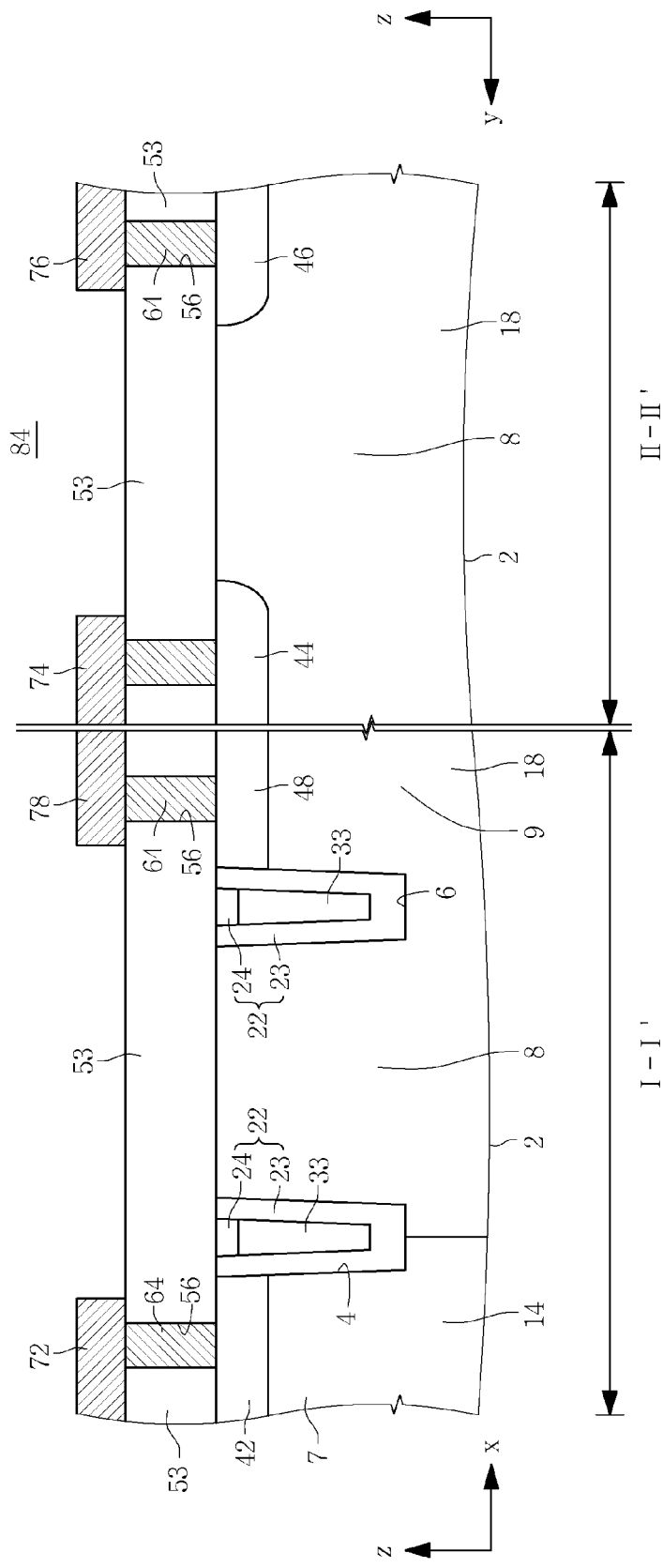
FIG. 7 is an exemplary cross-sectional view taken along lines I-I' and II-II' of FIG. 2A, illustrating a method of forming a semiconductor fuse circuit according to example embodiments.

FIG. 7 is a cross-sectional view taken along lines I-I' and II-II' of FIG. 2A, illustrating a method of forming a semiconductor fuse circuit according to example embodiments. FIG. 7 uses like reference numerals for like members as shown in FIGS. 4 through 6.

Referring to FIG. 7, according to example embodiments, a semiconductor substrate 2 may be prepared. First and second trenches 4 and 6 may be formed in the semiconductor substrate 2. First tunnel layers 23 may be formed in the first and second trenches 4 and 6, respectively. The first tunnel layers 23 may be conformally formed on sidewalls and bottom surfaces of the first and second trenches 4 and 6. The first tunnel layers 23 may include silicon oxide.

Charge trap layers 33 may be formed on the first tunnel layers 23, respectively. Unlike the charge trap layers 31a and 31b of FIG. 5, however, the charge trap layers 33 of FIG. 7 partially fill the first and second trenches 4 and 6. After forming the charge trap layers 33, second tunnel layers 24 may be formed on the charge trap layers 33 to completely fill the first and second trenches 4 and 6. The first and second tunnel layers 23 and 24 may surround or cover top surfaces, sidewalls, and bottom surfaces of the charge trap layers 33. The second tunnel layers 24 may include the same material as the first tunnel layers 23.

The first and second tunnel layers 23 and 24 may constitute complete tunnel layers 22. The complete tunnel layers 22 may surround the charge trap layers 33 in the X and Z directions, therefore, may not expose the charge trap layers 33 outside of the semiconductor substrate 2.

Furthermore, according to example embodiments, first through third active regions 7, 8, and 9, first and second well regions 14 and 18, and first through fourth node impurity regions 42, 44, 46, and 48 may be formed using the same process operations as in FIGS. 4 and 5. Also, according to example embodiments, an interlayer insulating layer 53, first through fourth connection holes 56, first plugs 64, and first through fourth nodes 72, 74, 76, and 78 may be formed using the same process operations as in FIG. 6.

Thus, in one embodiment, the first through fourth nodes 72, 74, 76, and 78 may constitute the semiconductor fuse circuit 84 together with the first through third active regions 7, 8, and 9, the first and second insulating layers, the first and second well regions 14 and 18, and the first through fourth node impurity regions 42, 44, 46, and 48.

Embodiment 3

Figure 8:
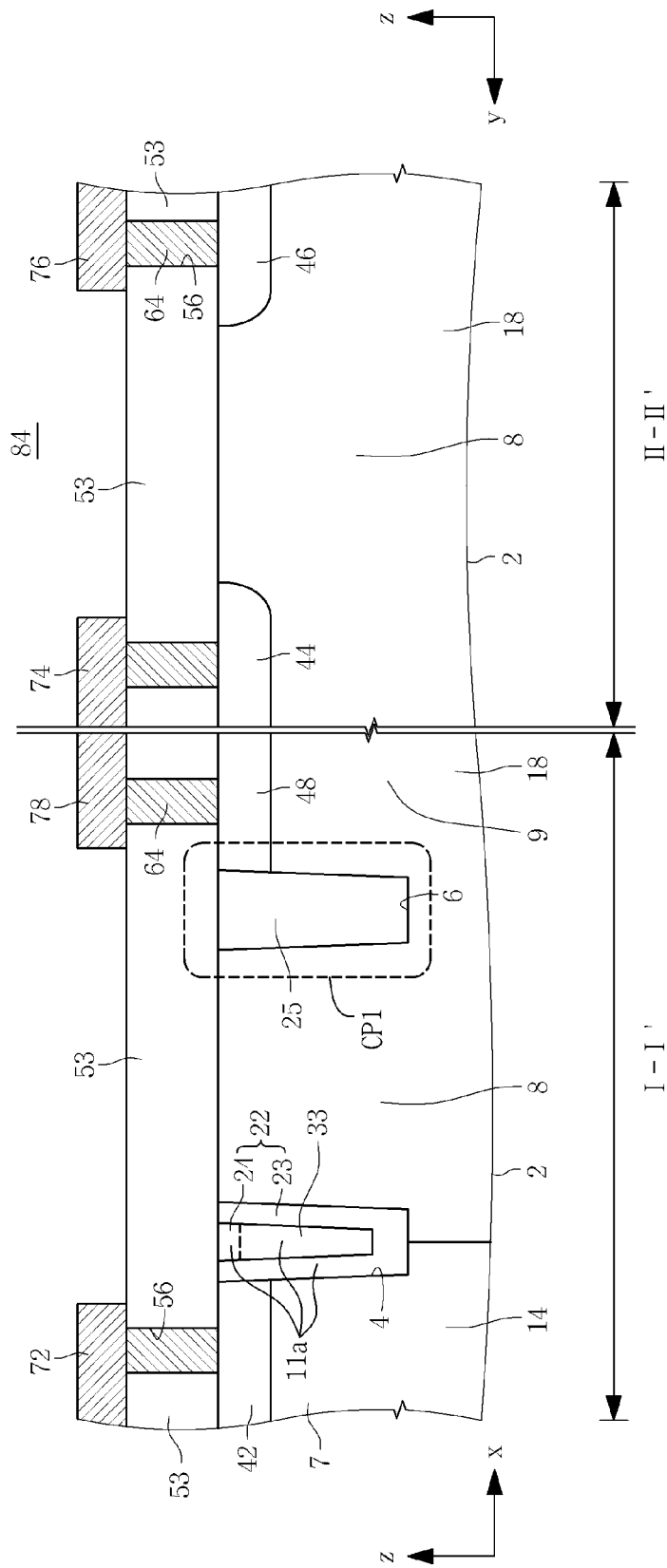
FIG. 8 is an exemplary cross-sectional view taken along lines I-I' and II-II' of FIG. 2A, illustrating a method of forming a semiconductor fuse circuit according to example embodiments.

FIG. 8 is a cross-sectional view taken along lines I-I' and II-II' of FIG. 2A, illustrating a method of forming a semiconductor fuse circuit according to example embodiments. FIG. 8 uses like reference numerals for like members as shown in FIGS. 4 through 6.

Referring to FIG. 8, according to example embodiments, a semiconductor substrate 2 may be prepared. First and second trenches 4 and 6 may be formed in the semiconductor substrate 2. The first insulating layer 11a of FIG. 6 or the complete tunnel layer 22 and charge trap layers 33 of FIG. 7 may be formed in the first trench 4.

In the embodiment shown in FIG. 8, a tunnel layer 25 is formed in the second trench 6. In this case, the tunnel layer 25 is singly formed to sufficiently fill the second trench 6. Thus, the tunnel layer 25 may not include a charge trap layer. According to example embodiments, first through third active regions 7, 8, and 9, first and second well regions 14 and 18, and first through fourth nodes 42, 44, 46, and 48 may be formed using the same process operations as in FIGS. 4 and 5.

In addition, according to example embodiments, an interlayer insulating layer 53, first through fourth connection holes 56, first plugs 64, and the first through fourth nodes 72, 74, 76, and 78 may be formed using the same process operations as in FIG. 6. Thus, the first through fourth nodes 72, 74, 76, and 78 may constitute a semiconductor fuse circuit 84 together with the first through third active regions 7, 8, and 9, the first and second insulating layers, the first and second well regions 14 and 18, and the first through fourth node impurity regions 42, 44, 46, and 48.

Embodiment 4

Figure 9:
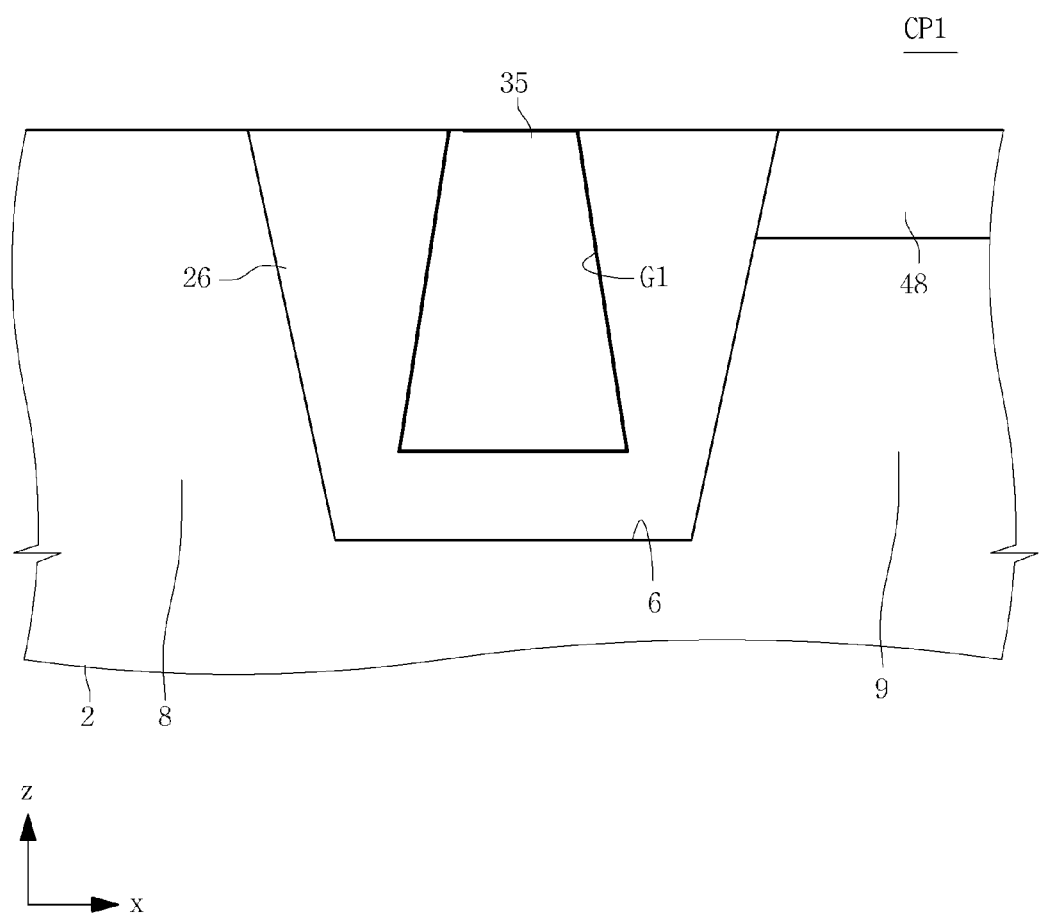
FIG. 9 is an exemplary enlarged cross-sectional view of a checkpoint of FIG. 8, illustrating a method of forming a semiconductor fuse circuit according to example embodiments.

FIG. 9 is an enlarged cross-sectional view of a checkpoint CP1 of FIG. 8, illustrating a method of forming a semiconductor fuse circuit according to example embodiments. FIG. 9 uses like reference numerals for like members as shown in FIGS. 4 through 6.

Referring to FIG. 9, according to example embodiments, a semiconductor substrate 2 may be prepared. A second trench 6 may be formed in the semiconductor substrate 2. A tunnel layer 26 may be formed in the second trench 6. The tunnel layer 26 may be formed in upper and lower portions of the second trench 6 at different deposition rates or to different thicknesses. In this case, the tunnel layer 26 may form a first groove G1 in the second trench 6.

When viewed vertically with respect to a top surface of the semiconductor substrate 2, the groove G1 may have a 2-dimensionally tapered shape (e.g., having a greater width in the X direction closer to the bottom of the trench than at the top of the trench). A charge trap layer 35 may be formed in the first groove G1 of the tunnel layer 26. The charge trap layer 35 may fill the first groove G1. The tunnel layer 26 and the charge trap layer 35 in the second trench 6 may constitute a second insulating layer.

The tunnel layer 26 and the charge trap layer 35 may also be formed in the first trench 4 of FIG. 8. Also, according to example embodiments, first through third active regions 7, 8, and 9, first and second well regions 14 and 18, and first through fourth node impurity regions 42, 44, 46, and 48 may be formed using the same process operations as in FIGS. 4 and 5. Furthermore, an interlayer insulating layer 53, first through fourth connection holes 56, first plugs 64, and first through fourth nodes 72, 74, 76, and 78 may be formed using the same process operations as in FIG. 6.

Thus, the first through fourth nodes 72, 74, 76, and 78 may constitute a different semiconductor fuse circuit than in FIG. 8 together with the first through third active regions 7, 8, and 9, the first insulating layer of FIG. 5 or 6, the second insulating layer of FIG. 9, the first and second well regions 14 and 18, and the first through fourth node impurity regions 42, 44, 46, and 48.

Embodiment 5

Figure 10:
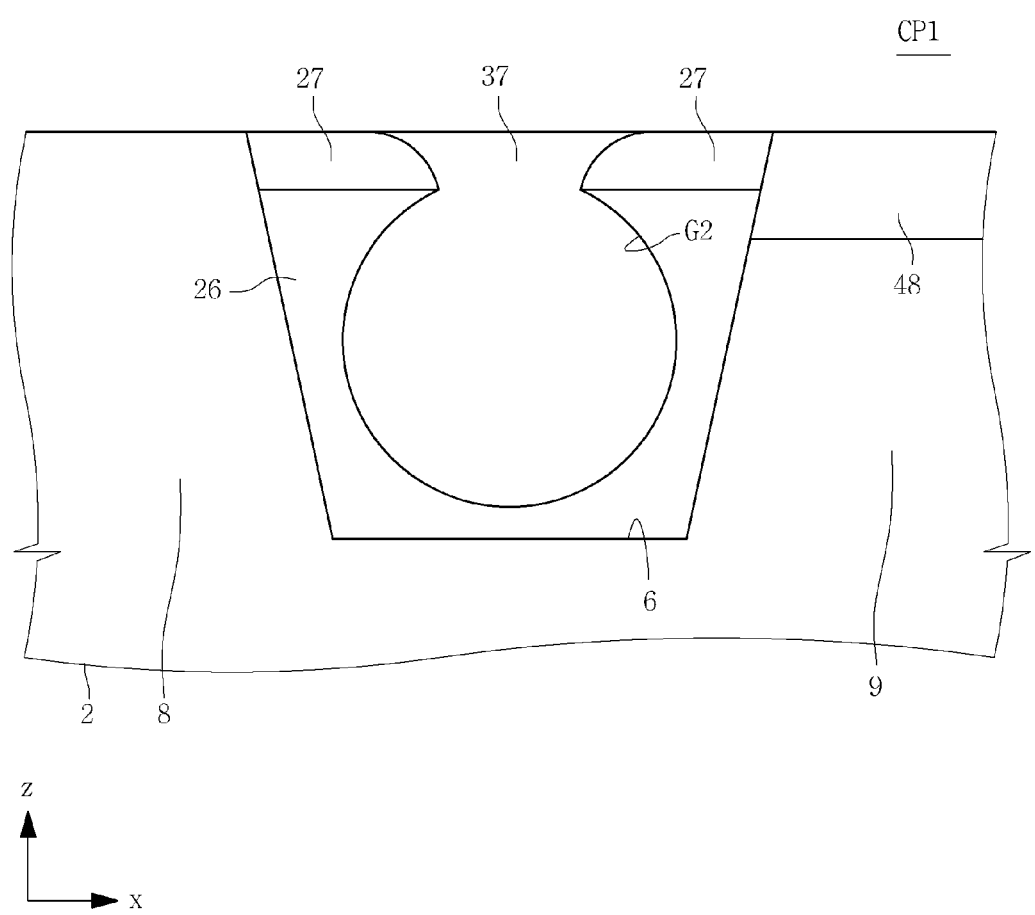
FIG. 10 is an exemplary enlarged cross-sectional view of a checkpoint of FIG. 8, illustrating a method of forming a semiconductor fuse circuit according to example embodiments.

FIG. 10 is an enlarged cross-sectional view of a checkpoint CP1 of FIG. 8, illustrating a method of forming a semiconductor fuse circuit according to example embodiments. FIG. 10 uses like reference numerals for like members as shown in FIGS. 4 through 6.

Referring to FIG. 10, according to example embodiments, a semiconductor substrate 2 may be prepared. A second trench 6 is formed in the semiconductor substrate 2. Tunnel layers 26 and 27 may be sequentially formed in the second trench 6. The tunnel layers 26 and 27 fill the second trench 6. In one embodiment, tunnel layer 26 formed in a lower portion of the second trench 6 have a higher etch rate than the tunnel layer 27 formed in an upper portion of the second trench 6. The tunnel layer 27 may be etched to form an opening therein.

The tunnel layer 26 may be etched using the tunnel layer 27 as an etch mask and/or a buffer layer, thereby forming a second groove G2 in the tunnel layers 26 and 27. When viewed vertically with respect to a top surface of the semiconductor substrate 2, the second groove G2 may have a curved, 2-dimensional jar shape. Alternatively, the second groove G2 may be singly formed in one tunnel layer. A charge trap layer 37 may be formed in the second groove G2 in the tunnel layers 26 and 27.

The charge trap layer 37 may fill the second groove G2. The tunnel layers 26 and 27 and the charge trap layer 37 in the second trench 6 may constitute a second insulating layer. The tunnel layers 26 and 27 and the charge trap layer 37 may be formed in the second trench 6 of FIG. 8, and/or may also be formed in the first trench 4. In addition, according to example embodiments, first through third active regions 7, 8, and 9, first and second well regions 14 and 18, and first through fourth node impurity regions 42, 44, 46, and 48 may be formed using the same process operations as in FIGS. 4 and 5.

Furthermore, example embodiments may embody an interlayer insulating layer 53, first through fourth connection holes 56, first plugs 64, and first through fourth nodes 72, 74, 76, and 78 using the same process operations as in FIG. 6. Thus, the first through fourth nodes 72, 74, 76, and 78 may constitute a different semiconductor fuse circuit than in FIG. 8 together with the first through fourth active regions 7, 8, and 9, the first insulating layer of FIG. 5 or 6, the second insulating layer of FIG. 10, the first and second well regions 14 and 18, and the first through fourth node impurity regions 42, 44, 46, and 48.

Embodiment 6

Figure 11:
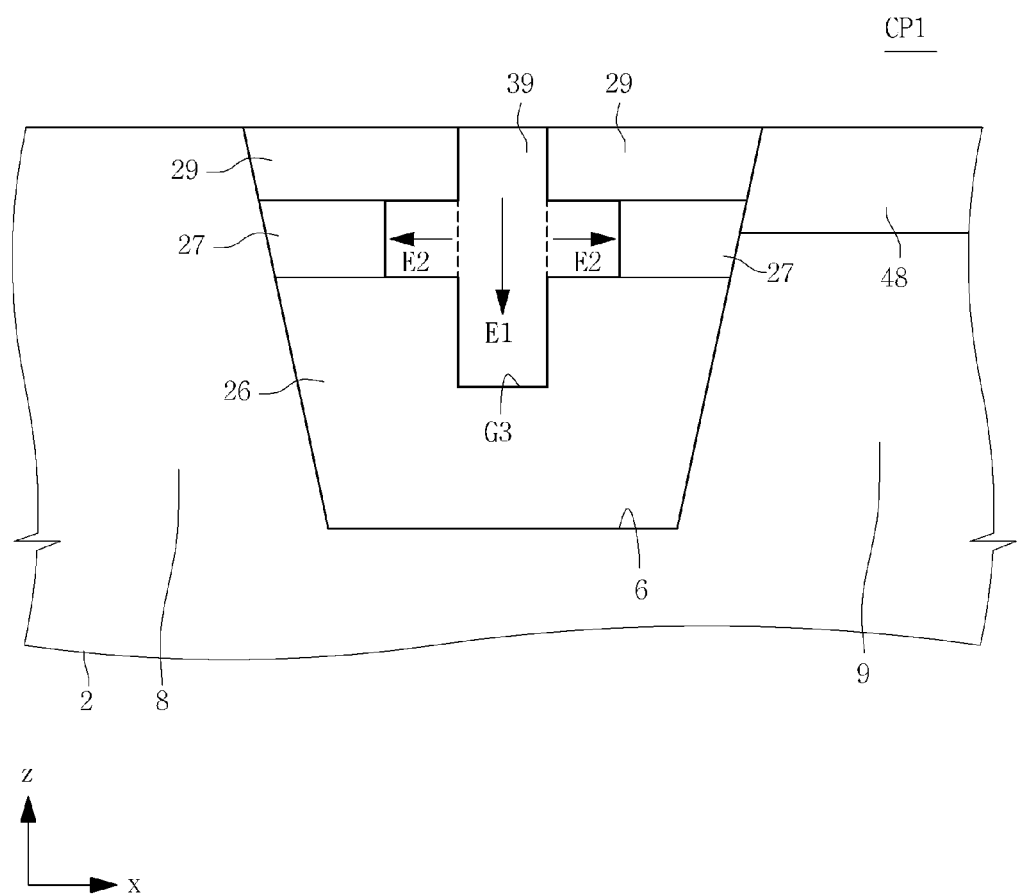
FIG. 11 is an exemplary enlarged cross-sectional view of a checkpoint of FIG. 8, illustrating a method of forming a semiconductor fuse circuit according to example embodiments.

FIG. 11 is an enlarged cross-sectional view of a checkpoint of FIG. 8, illustrating a method of forming a semiconductor fuse circuit according to example embodiments. FIG. 11 uses like reference numerals for like members as shown in FIGS. 4 through 6.

Referring to FIG. 11, according to example embodiments, a semiconductor substrate 2 may be prepared. A second trench 6 may be formed in the semiconductor substrate 2. Tunnel layers 26, 27, and 29 may be sequentially formed in the second trench 6. The tunnel layers 26, 27, and 29 may fill the second trench 6. In one embodiment, tunnel layers 26 and 29 formed in lower and upper portions of the second trench 6 have a lower etch rate than the tunnel layer 27 formed in an intermediate portion of the second trench 6.

The tunnel layers 26, 27, and 29 may be etched along a first etching direction E1 to form an opening in the tunnel layers 26, 27, and 29. The tunnel layer 27 formed in the intermediate portion of the second trench 6 may be etched along a second etching direction E2 using the tunnel layers 26 and 29 formed in the lower and upper portions of the second trench as an etch mask and/or a buffer layer. As a result, the tunnel layers 26, 27, and 29 may have a third groove G3 along the first and second etching directions E1 and E2.

The third groove G3 may have a 2-dimensional cross shape when vertically viewed with respect to a top surface of the semiconductor substrate 2. A charge trap layer 39 is then formed in the third groove G3 formed in the tunnel layers 26, 27, and 29. The charge trap layer 39 may fill the third groove G3. The tunnel layers 26, 27, and 29 and the charge trap layer 39 in the second trench 6 may constitute a second insulating layer. The tunnel layers 26, 27, and 29 and the charge trap layer 38 may also be formed in the first trench 4 of FIG. 8.

In addition, example embodiments may include first through third active regions 7, 8, and 9, first and second well regions 14 and 18, and first through fourth node impurity regions 42, 44, 46, and 48 using the same process operations of FIGS. 4 and 5. Furthermore, example embodiments may embody an interlayer insulating layer 53, first through fourth connection holes 56, first plugs 64, and first through fourth nodes 72, 74, 76, and 78 using the same process operations as in FIG. 6.

As a result, the first through fourth nodes 72, 74, 76, and 78 may constitute a different semiconductor fuse circuit than in FIG. 8 together with the first through third active regions 7, 8, and 9, the first insulating layer of FIG. 5 or 6, the second insulating layer of FIG. 11, the first and second well regions 14 and 18, and the first through fourth node impurity regions 42, 44, 46, and 48.

As depicted in FIGS. 6-11, first and second insulating layers can be formed in different manners to have differently-shaped grooves filled with a charge trap layer, and to be either exposed or not exposed outside a top surface of semiconductor substrate 2. Different combinations of these configurations can be arranged in different ways. For example, the first insulating layer can include any of the grooves described in FIGS. 6-11, and the second insulating layer can include the same type of groove as the first insulating layer, or a different one of the grooves described in FIGS. 6-11.

Embodiment 7

Figure 12:
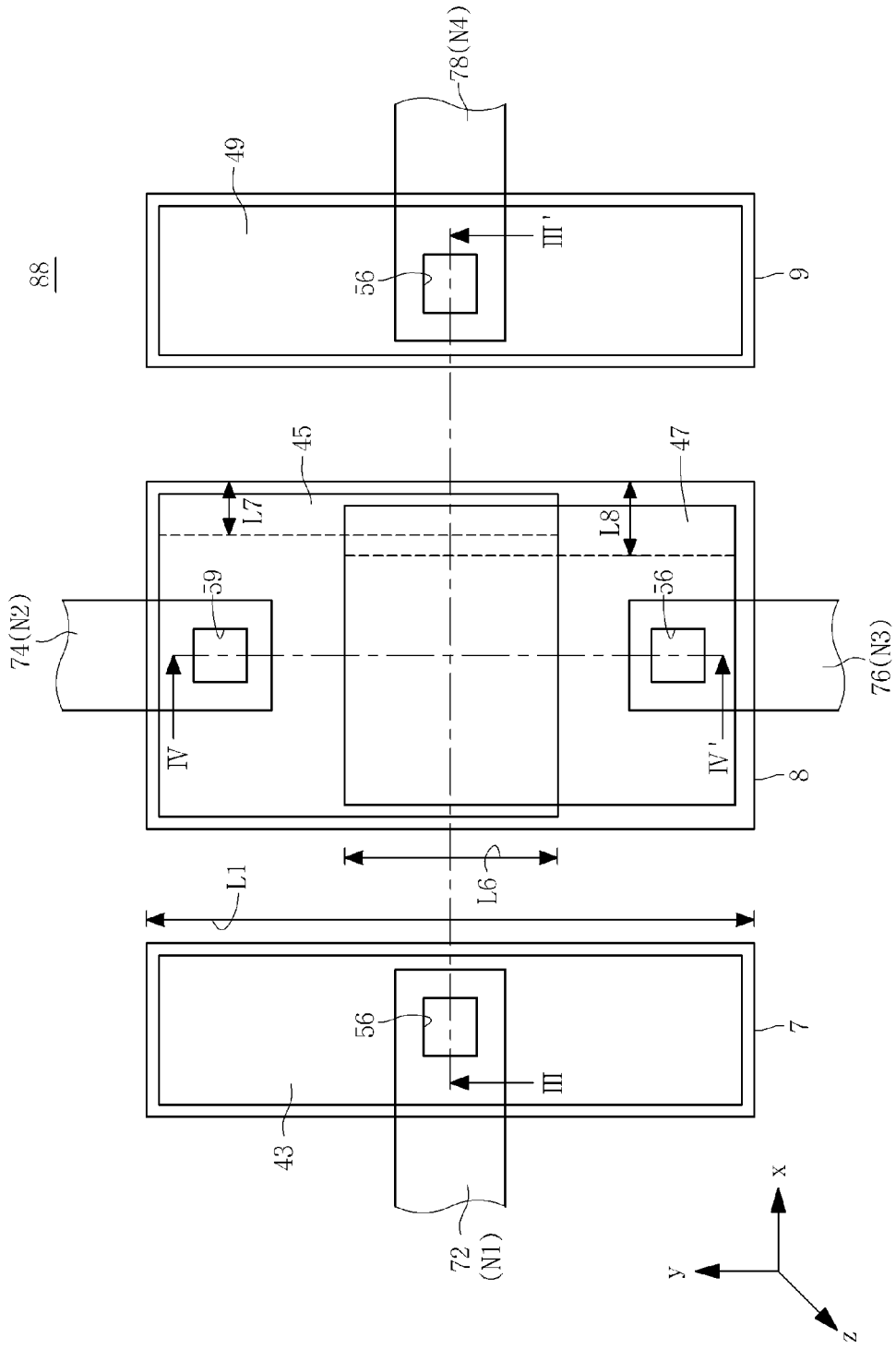
FIG. 12 is a plan view of an exemplary semiconductor fuse circuit disposed in a fuse region of FIG. 1.

FIG. 12 is a plan view of a semiconductor fuse circuit disposed in a fuse region of FIG. 1, according to an exemplary embodiment. FIG. 12 uses like reference numerals for like members as shown in FIG. 2A.

Referring to FIG. 12, a semiconductor fuse circuit 88 according to example embodiments may be disposed in the fuse region B of FIG. 1. The semiconductor fuse circuit 88 may include first through third active regions 7, 8, and 9. The first through third active regions 7, 8, and 9 may be sequentially disposed along an X direction. The first active region 7 may have a predetermined length L1 along a Y direction. The first active region 7 may include a first node impurity region 43.

The first node impurity region 43 may have the same conductivity type as the first node impurity region 42 of FIG. 2A. The first node impurity region 43 may have substantially the same length as or a different length from the first active region 7 along the Y direction. The first node impurity region 43 may correspond to a gate region of a transistor. A first node 72(N1) may extend from the first node impurity region 43 toward the outside of the first active region 7 along the X direction. The first node 72 may partially overlap the first node impurity region 43. The first node 72 may be electrically connected to the first node impurity region 43 through a first connection hole 56.

The second active region 8 may have second and third node impurity regions 45 and 47. The second and third node impurity regions 45 and 47 may have the same conductivity type as the first node impurity region 43.

The second and third node impurity regions 45 and 47 may extend toward each other along the Y direction and overlap each other by a predetermined length L6. A side surface of the second and third node impurity regions 45 and 47 may face a side surface of the first node impurity region 43 along the X direction. Another side surface (e.g., an opposite side surface) of the second and third node impurity regions 45 and 47 may face a side surface of the third node impurity region 49 along the X direction.

The second node impurity region 45 may be spaced a predetermined length L7 apart from one side portion of the second active region 8 along the X direction, or may extend to the end of the second active region 8 at the side portion in the X direction. The second node impurity region 45 may also be spaced apart from another side portion of the second active region 8 along the Y direction. The second node impurity region 45 may correspond to a source region or drain region of a transistor.

The third node impurity region 47 may be spaced a predetermined length L8 apart from the one side portion of the second active region 8 in the X direction, or may extend to the end of the second active region 8 at the side portion in the X direction. The third node impurity region 47 may be spaced apart from another side portion of the second active region 8 along the Y direction. The third node impurity region 47 may correspond to the drain region or source region of the transistor.

The length L7 between the second node impurity region 45, and the one side portion of the second active region 8 may be equal to or different from the length L8 between the third node impurity region 47, and the one side portion of the second active region 8 in the X direction. A second node 74(N2) and a third node 76(N3) may extend from the second and third node impurity regions 45 and 47 toward the outside of the second active region 8. The second and third nodes 74 and 76 may vertically overlap second and third node impurity regions 45 and 47, respectively.

The second node 74 may be electrically connected to the second node impurity region 45 through a second connection hole 59. The third node 76 may be electrically connected to the third node impurity region 47 through a third connection hole 56. The third active region 9 may have a fourth node impurity region 49. The fourth node impurity region 49 may have a different conductivity type from the first through third node impurity regions 43, 45, and 47.

The fourth node impurity region 49 may have substantially the same length as or a different length from the third active region 9 along the Y direction. The fourth node impurity region 49 may face the second and third node impurity regions 45 and 47 in the X direction. The fourth node impurity region 49 may correspond to a body or sub-region of a transistor. A fourth node 78(N4) may extend from the fourth node impurity region 49 toward the outside of the third active region 9 along the X direction.

The fourth node 78 may be electrically connected to the fourth node impurity region 49 through a fourth connection hole 56. The fourth node 78 may overlap the fourth node impurity region 49.

Figure 13:
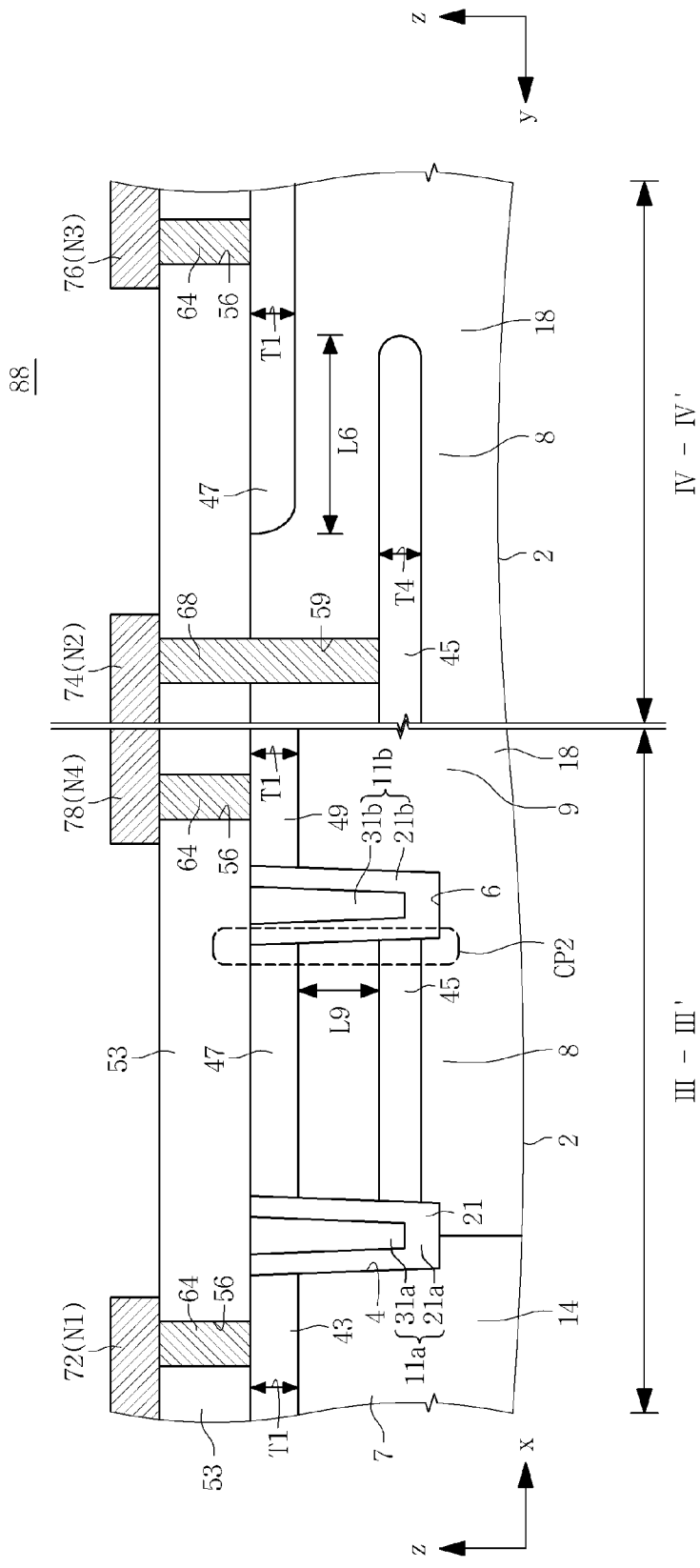
FIG. 13 is an exemplary cross-sectional view taken along lines III-III' and IV-IV' of FIG. 12, showing a semiconductor fuse circuit according to example embodiments.

FIG. 13 is a cross-sectional view taken along lines III-III' and IV-IV' of FIG. 12, showing a semiconductor fuse circuit according to example embodiments. FIG. 13 uses like reference numerals for like members as shown in FIG. 3.

Referring to FIG. 13, the semiconductor fuse circuit 88 according to example embodiments may include first and second insulating layers 11a and 11b sequentially disposed in the X direction. The first and second insulating layers 11a and 11b may define the first through third active regions 7, 8, and 9 of FIG. 12. In this case, the first insulating layer 11a may be buried in a first trench 4 between the first and second active regions 7 and 8. The second insulating layer 11b may be buried in a second trench 6 between the second and third active regions 8 and 9.

The first and second insulating layers 11a and 11b may include the tunnel layers 21a and 21b and the charge trap layers 31a and 31b. Alternatively, each of the tunnel layers 21a and 21b may be replaced by the tunnel layer 23 of FIG. 7, the tunnel layer 25 of FIG. 8, the tunnel layer 26 of FIG. 9, the tunnel layers 26 and 27 of FIG. 10, or the tunnel layers 26, 27, and 29 of FIG. 11. Similarly, each of the charge trap layers 31a and 31b may be replaced by the charge trap layer 33 of FIG. 7, the charge trap layer 35 of FIG. 9, the charge trap layer 37 of FIG. 10, or the charge trap layer 39 of FIG. 11.

First through fourth node impurity regions 43, 45, 47, and 49 may be disposed in the semiconductor substrate 2. The first and fourth node impurity regions 43 and 49 may be electrically insulated from the second and third node impurity regions 45 and 47 by first and second insulating layers 11a and 11b. As shown in FIG. 3, the first and fourth node impurity regions 43 and 49 may be disposed in the first and third active regions 7 and 9. The second and third node impurity regions 45 and 47 may be disposed in the second active region 8.

In this embodiment, the second and third node impurity regions 45 and 47 may be disposed at different levels in the second active region 8 in the Z direction in a longitudinal cross-sectional view. In one embodiment, the third node impurity region 47 is disposed at the same level as the first and fourth node impurity regions 43 and 49, but the second node impurity region 45 is disposed at a different level. The second and third node impurity regions 45 and 47 may be parallel to each other along planes defined by the X and Y directions, and may overlap each other in the X and Y directions in a central region of the second active region 8.

The first, third, and fourth node impurity regions 43, 47, and 49 may have the same thickness T1 or different thicknesses. The second node impurity region 45 may have a predetermined thickness T4. The second node impurity region 45 may have the same thickness as or a different thickness from the first, third, and fourth node impurity regions 43, 47, and 49. The second and third node impurity regions 45 and 47 may be spaced a predetermined length L9 apart from each other along the Z direction.

The second and third node impurity regions 45 and 47 may be in contact with the first and second insulating layers 11a and 11b, respectively. At least one of the second and third node impurity regions 45 and 47 may be in contact with the second insulating layer 11b at a checkpoint CP2. Alternatively, one or both of the second and third node impurity regions 45 and 47 may not be in contact with the second insulating layer 11b at a checkpoint CP2.

The interlayer insulating layer 53 and the first through fourth nodes 72, 74, 76, and 78 may be disposed on the first through third active regions 7, 8, and 9. The first plugs 64 may be disposed in the interlayer insulating layer 53. The first plugs 64 may be in contact with first, third, and fourth node impurity regions 43, 47, and 49 through first connection holes 56 of the interlayer insulating layer 53.

A second plug 68 may be disposed in the interlayer insulating layer 53 and the second active region 8. The second plug 68 may be electrically connected to the second node impurity diffused region 45 through second connection hole 59. The first and second plugs 64 and 68 may be electrically connected to the first through fourth nodes 72, 74, 76, and 78. The second connection hole 59 may therefore be longer in the Z direction than first, third, and fourth connection holes 56.

As described above, the transistors and semiconductor fuse circuits 84 and 88 and the methods of forming the same according to the example embodiments are explained with reference to FIGS. 2A through 13. Next, an electrical operation of each of the semiconductor fuse circuits 84 and 88 will be described below with reference to FIG. 3.

Referring to FIG. 3, when the semiconductor fuse circuit 84 according to example embodiments embodies an NMOS transistor, process conditions of node impurity regions may be arranged as shown in the following Table 1.

TABLE 1

Process conditions of NMOS node impurity regions

| Node impurity regions | Conductivity types |
|---|---|
| First node impurity region 42 | N type |
| Second node impurity region 44 | N type |
| Third node impurity region 46 | N type |
| Fourth node impurity region 48 | P type |
| First well region 14 | N type |
| Second well region 18 | P type |

To enable an operation of the NMOS transistor, the semiconductor fuse circuit 84 may operate based on conditions of a node voltage according to an operational mode as shown in Table 2 below.

TABLE 2

Conditions of node voltage according to operational mode

| Mode | Stress | N1 | N2 | N3 | N4 |
|---|---|---|---|---|---|
| Programming | HCI | >5 (V) (applied as pulse type) | 0 (V) (applied as pulse type) | ≤N1 (applied as pulse type) | 0 (V) (applied as pulse type) |
|  | FN | Constant (>9 (V)) (applied as pulse type) | 0 (V) (applied as pulse type) | 0 (V) (applied as pulse type) | 0 (V) (applied as pulse type) |
| Read | — | 3~3.5 (V) | 0 (V) | 3 (V) | 0 (V) |
| Erase | — | 0 (V) | Positive voltage (applied as pulse type) | Positive voltage (applied as pulse type) | 0 (V) |

The semiconductor fuse circuit 84 may store electrons in a charge trap layer 31 by applying a hot carrier injection (HCI) stress or a Fowler-Nordheim (FN) stress in a programming mode. In this case, the electrons may be generated in a channel between the nodes N2 and N3, pass through a tunnel layer 21a, and be trapped in the charge trap layer 31a. Since the charge trap layer 31a is surrounded by the tunnel layer 21a on both sidewalls and underneath the charge trap layer 31a (and optionally above the charge trap layer 31a), a probability that the electrons will be leaked to a semiconductor substrate 2 between programming, read, and erase modes may be lower than in the conventional art.

Accordingly, the semiconductor fuse circuit 84 may write desired electrical data in the charge trap layer 31a in the programming and erase modes more stable than in the conventional art. The semiconductor fuse circuit 84 may confirm the desired electrical data from the charge trap layer 31a in the read mode more stable than in the conventional art. The semiconductor fuse circuit 84 may embody characteristics of a desired transistor using the charge trap layer 31a more reliably than in the conventional art.

Alternatively, when the semiconductor fuse circuit 84 according to example embodiments embodies a PMOS transistor, process conditions of node impurity regions may be arranged as shown in a Table 3 below.

TABLE 3

| Process conditions of PMOS node impurity regions | |
|---|---|
| Node impurity regions | Conductivity types |
| First node impurity region 42 | P type |
| Second node impurity region 44 | P type |
| Third node impurity region 46 | P type |
| Fourth node impurity region 48 | N type |
| First well region 14 | P type |
| Second well region 18 | N type |

To enable an operation of a PMOS transistor, the semiconductor fuse circuit 84 may operate based on conditions of a node voltage according to an operational mode as shown in a Table 4 below.

TABLE 4

| Conditions of node voltage according to operational mode | | | | | |
|---|---|---|---|---|---|
| Mode | Stress | N1 | N2 | N3 | N4 |
| Programming | HEIP | V1 | −V2 < 0 | 0~V1 (apply AC voltage) | V1 |
| Read | — | 3~3.5 (V) | 0 (V) | 3 (V) | 0 (V) |
| Erase | — | 0 (V) | Positive voltage (applied as pulse type) | Positive voltage (applied as pulse type) | 0 (V) |

The semiconductor fuse circuit 84 may store electrons in the charge trap layer 31a in the programming mode by applying a hot electron induced punch-through (HEIP) stress. In this case, the electrons may be generated in a channel between nodes N2 and N3, pass through the tunnel layer 21a, and be trapped in the charge trap layer 31a. Since the charge trap layer 31a is surrounded by the tunnel layer 21a on both sidewalls and underneath the charge trap layer 31a (and optionally above the charge trap layer 31a), a probability that the electrons will be leaked to the semiconductor substrate 2 between programming, read, and erase modes may be lower than in the conventional art.

Thus, the semiconductor fuse circuit 84 may write desired electrical data in the charge trap layer 31a in the programming and erase modes more stable than in the conventional art. The semiconductor fuse circuit 84 may confirm the desired electric data from the charge trap layer 31a in the read mode more stable than in the conventional art. The semiconductor fuse circuit 84 may embody characteristics of a desired transistor using the charge trap layer 31a more reliably than in the conventional art.

Accordingly, when the semiconductor fuse circuit 84 is embodied by an NMOS or PMOS transistor, the semiconductor fuse circuit 84 may control the flow of charges between the nodes N2 and N3 to sufficiently function as a desired electrical fuse.

Figure 14:
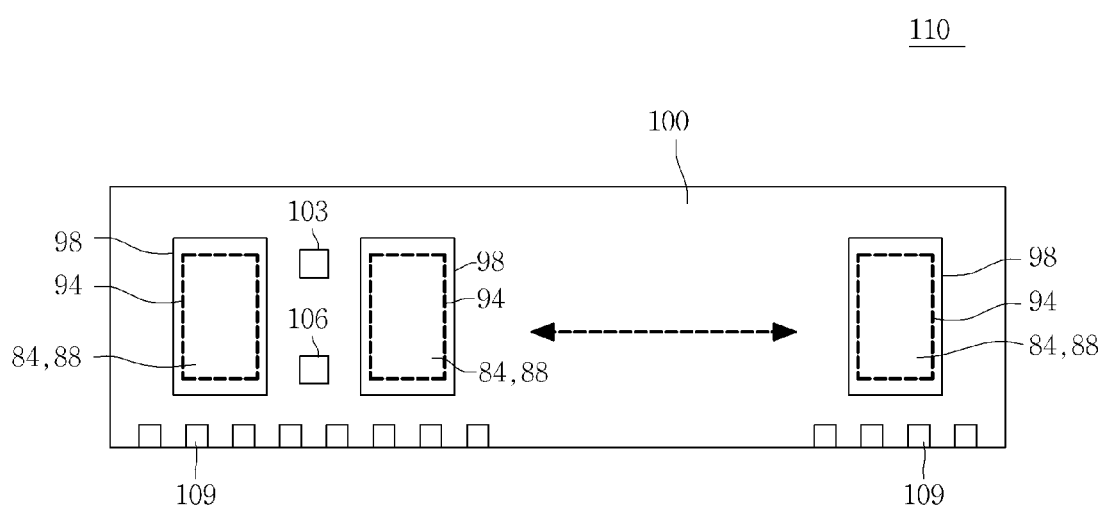
FIG. 14 is a plan view of an exemplary semiconductor module including a semiconductor fuse circuit of FIG. 2A or FIG. 12.

FIG. 14 is an exemplary plan view of a semiconductor module including a semiconductor device 94 having the at least one semiconductor fuse circuits 84 and 88.

Referring to FIG. 14, a semiconductor module 110 according to example embodiments may include a module substrate 100. The module substrate 100 may be a PCB or a plate including an electric circuit. The module substrate 100 may include internal circuits (not shown), electric pads (not shown), and connectors 109. The internal circuits may be electrically connected to the electric pads and the connectors 109. Semiconductor package structures 98 and at least one resistor 103 may be disposed on the module substrate 100.

Alternatively, the semiconductor package structures 98, the at least one resistor 103, and at least one condenser 106 may be disposed on the module substrate 100. The semiconductor package structures 98 may be electrically connected to electric pads along with the at least one resistor 103 and/or the at least one condenser 106. Each of the semiconductor package structures 98 may include at least one semiconductor device 94 (e.g., a semiconductor chip). The semiconductor device 94 may include the semiconductor fuse circuit 84.

The semiconductor device 94 may also include the semiconductor fuse circuit 88. Thus, the semiconductor module 110 may have better electrical properties than in the conventional art. The semiconductor module 110 may be electrically connected to the processor-based system 150 through the connectors 109 thereof.

Figure 15:
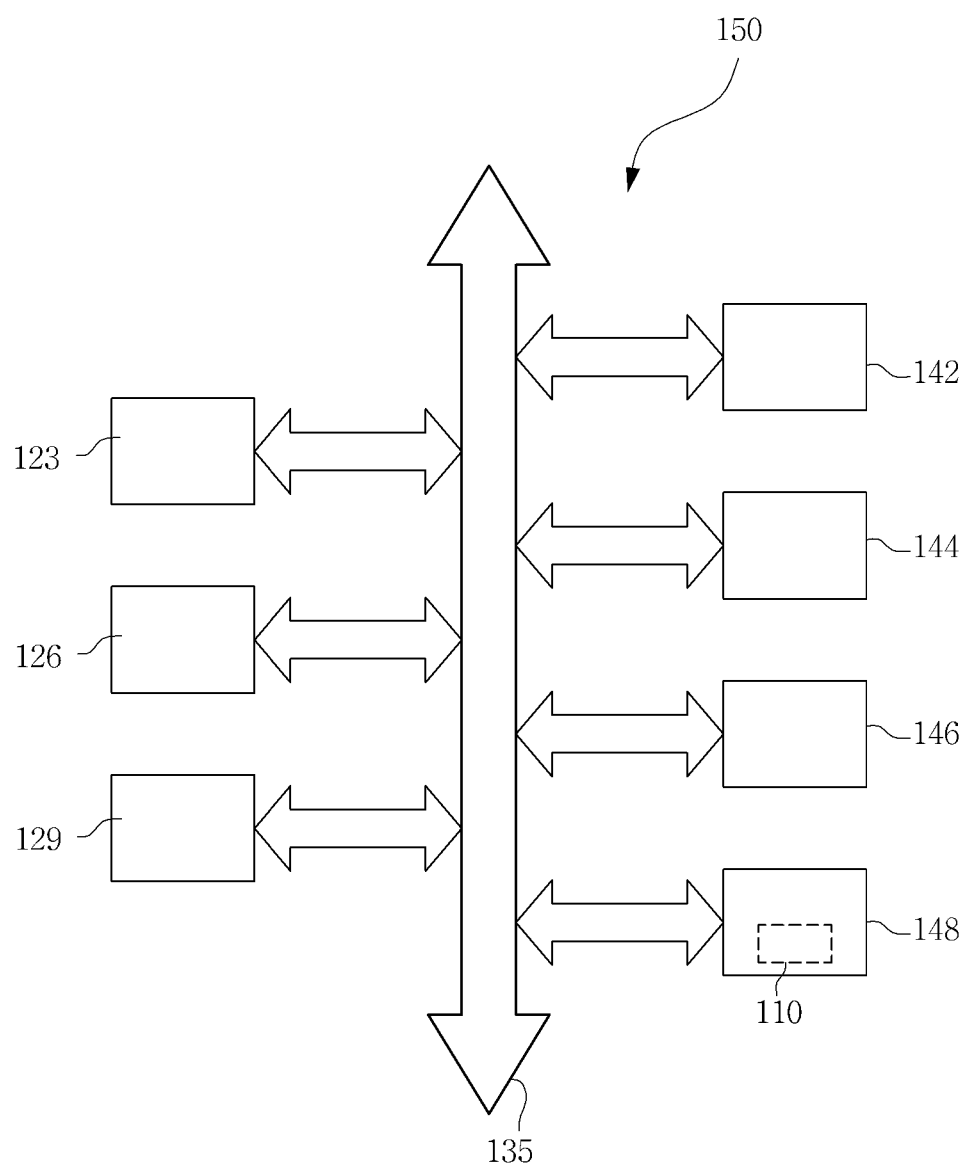
FIG. 15 is a plan view of an exemplary processor-based system including the semiconductor module of FIG. 14.

FIG. 15 is an exemplary plan view of a processor-based system including the semiconductor module of FIG. 14, according to one embodiment.

Referring to FIG. 15, a processor-based system 150 according to example embodiments may include at least one system board (not shown). The at least one system board may include at least one bus line 135. A first module unit may be disposed on the at least one bus line 135. The first module unit may be electrically connected to the at least one bus line 135. The first module unit may include a central processing unit (CPU) 123, a floppy disk drive (FDD) 126, and a compact disk (CD) ROM drive 129. In addition, a second module unit may be disposed on the at least one bus line 135. The second module unit may be electrically connected to the at least one bus line 135.

The second module unit may include a first input/output (I/O) device 142, a second I/O device 144, a read-only memory (ROM) 146, and a random access memory (RAM) 148. The RAM 148 may include the semiconductor module 110 of FIG. 14. Also, the RAM 148 may separately include the at least one semiconductor fuse circuit 84 or 88. The RAM 148 may separately include the semiconductor fuse circuit 88 of FIG. 13.

The semiconductor module 110 may be disposed in a first module unit and/or a second module unit other than the RAM 148. The semiconductor fuse circuit 84 or 88 may be individually disposed in a first module unit and/or a second module unit other than the RAM 148. Thus, the processor-based system 150 may have better electrical properties than in the conventional art. The processor-based system 150 may include a computer system, a process control system, or another system.

As described above, example embodiments provide a semiconductor fuse circuit, a semiconductor device, and a semiconductor module in which a tunnel layer is formed adjacent to a charge trap layer as a sandwich type in a semiconductor substrate. The charge trap layer may not leak electrons to the semiconductor substrate during an electrical operation of the semiconductor fuse circuit, the semiconductor device, or the semiconductor module due to electrical and physical barriers of the tunnel layer. As a result, the semiconductor fuse circuit may electrically connect or disconnect adjacent semiconductor circuits using the charge trap layer more reliably than in the conventional art.

The semiconductor fuse circuit may be disposed in the semiconductor device. The semiconductor device may be a nonvolatile memory device or a volatile memory device. The semiconductor device may cure defects between the adjacent semiconductor circuits using the semiconductor fuse circuit, thereby being obtained from the semiconductor substrate in a higher productivity as compared with the conventional art. The semiconductor device may be disposed in the semiconductor module to improve electrical properties of the semiconductor module as compared with the conventional art.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a semiconductor substrate;
a first node impurity region disposed in the semiconductor substrate, the first node impurity region having: a first longitudinal length in a first direction, a first transverse length in a second direction perpendicular to the first direction, and a first thickness in a third direction perpendicular to both the first direction and the second direction, wherein the first node impurity region includes a first side surface
a second node impurity region disposed in the semiconductor substrate, the second node impurity region having: a second longitudinal length in the first direction, a second transverse length in the second direction, and a second thickness in the third direction, wherein the second node impurity region includes a second side surface,
a third node impurity region disposed in the semiconductor substrate, the third node impurity region having: a third longitudinal length in the first direction, a third transverse length in the second direction, and a third thickness in the third direction, wherein the third node impurity region includes a third side surface, and
a first insulating layer disposed in the semiconductor substrate, the first insulating layer being located between the first side surface of the first node impurity region and the second side surface of the second node impurity region, and between the first side surface of the first node impurity region and the third side surface of the third node impurity region,
wherein the first insulating layer includes a first layer and a second layer, and wherein sidewalls of the second layer are covered by the first layer.

2. The semiconductor device of claim 1, wherein the first node impurity region is electrically insulated from the second and third node impurity regions by the first insulating layer, and wherein the first through third node impurity regions have a first conductive type.

3. The semiconductor device of claim 1, wherein the first insulating layer is in contact with the first through third side surfaces.

4. The semiconductor device of claim 3, further comprising:
a first well region disposed in the semiconductor substrate to cover a bottom of the first node impurity region; and
a second well region disposed in the semiconductor substrate to cover bottoms of the second and third node impurity regions,
wherein the first well region has the first conductivity type and the second well region has a second conductivity type different from the first conductivity type, and
wherein the first and second well regions are in contact with each other under the first insulating layer.

5. The semiconductor device of claim 4, wherein the first, second, and third node impurity regions have a higher impurity concentration than the first well region.

6. The semiconductor device of claim 4, further comprising:
a fourth node impurity region disposed in the semiconductor substrate, the fourth node impurity region having:
a fourth longitudinal length in the first direction,
a fourth transverse length in the second direction, and
a fourth thickness in the third direction,
wherein the fourth node impurity region includes a fourth side surface.

7. The semiconductor device of claim 6, wherein the second well region covers a bottom of the fourth node impurity region, and wherein the fourth node impurity region has the second conductivity type.

8. The semiconductor device of claim 4, further comprising:
a second insulating layer in the semiconductor substrate, the second insulating layer spaced the second longitudinal length apart from the first insulating layer in the first direction,
wherein the second insulating layer is located between the second node impurity region and the fourth node impurity region, and between the third node impurity region and the fourth node impurity region.

9. The semiconductor device of claim 8, wherein the second well region covers a bottom surface of the second insulating layer.

10. The semiconductor device of claim 8, wherein the second insulating layer includes a third layer and a fourth layer, and wherein sidewalls of the fourth layer are covered by the third layer.

11. The semiconductor device of claim 1, wherein the first layer has a first permittivity and the second layer has a second permittivity greater than the first permittivity.

12. The semiconductor device of claim 11, wherein the first layer includes silicon oxide and the second layer includes silicon nitride.

13. The semiconductor device of claim 1, wherein a top surface of the second layer is exposed to the outside of the semiconductor substrate.

14. The semiconductor device of claim 1, wherein a top surface and a bottom surface of the second layer is covered by the first layer.

15. The semiconductor device of claim 1, further comprising:
an interlayer insulating layer covering top surfaces of the first through third node impurity regions and the first insulating layer; and
first through third nodes disposed on the interlayer insulating layer and electrically connected to the first through third node impurity regions, respectively.

16. A semiconductor device, comprising:
a semiconductor substrate;

a transistor gate region disposed in the semiconductor substrate and including a first side surface having a first thickness in a direction toward the interior of the semiconductor substrate;

an insulating layer adjacent to the transistor gate region and having a second thickness in the direction greater than the first thickness, wherein the insulating layer includes a second side surface and a third side surface opposite to the second side surface, and wherein the first side surface is in contact with the second side surface;

a transistor source region disposed adjacent to the third side surface and including a fourth side surface having a third thickness in the direction, and wherein the fourth side surface is in contact with the third side surface;

a transistor drain region disposed adjacent to the third side surface and including a fifth side surface having a fourth thickness in the direction, and wherein the fifth side surface is in contact with the third side surface; and a channel region between the transistor source region and the transistor drain region, wherein top surfaces of the semiconductor substrate, the transistor gate region, the transistor source region, and the transistor drain region have the same level.

17. The semiconductor device of claim 16, wherein the first thickness, third thickness, and fourth thickness are substantially the same, and wherein the second thickness is greater than the first, third and fourth thicknesses.

18. The semiconductor device of claim 16, wherein the insulating layer includes a tunnel layer having a first permittivity and a charge trap layer having a second permittivity greater than the first permittivity, and wherein the tunnel layer covers sidewalls and a bottom of the charge trap layer.

19. The semiconductor device of claim 18, wherein the tunnel layer is in contact with the second and third side surfaces.

20. A semiconductor module comprising:
a module substrate including at least one semiconductor device,
wherein the at least one semiconductor device comprises:
a semiconductor substrate;
a first node impurity region disposed in the semiconductor substrate, the first node impurity region having:
a first longitudinal length in a first direction,
a first transverse length in a second direction perpendicular to the first direction, and
a first thickness in a third direction perpendicular to both the first direction and the second direction,
wherein the first node impurity region includes a first side surface,
a second node impurity region disposed in the semiconductor substrate, the second node impurity region having:
a second longitudinal length in the first direction,
a second transverse length in the second direction, and
a second thickness in the third direction,
wherein the second node impurity region includes a second side surface,
a third impurity region disposed in the semiconductor substrate, the third node impurity region having:
a third longitudinal length in the first direction,
a third transverse length in the second direction, and
a third thickness in the third direction,
wherein the third node impurity region includes a third side surface, and
an insulating layer disposed in the semiconductor substrate, the insulating layer being located between the first side surface of the first node impurity region and the second side surface of the second node impurity region, and between the first side surface of the first node impurity region and the third side surface of the third node impurity region,
wherein the insulating layer includes a first layer and a second layer, and
wherein sidewalls of the second layer are covered by the first layer.

* * * * *